US012666794B2

(12) United States Patent
Inuzuka et al.

(10) Patent No.: US 12,666,794 B2
(45) Date of Patent: Jun. 23, 2026

(54) DISPLAY DEVICE

(71) Applicant: SHARP KABUSHIKI KAISHA, Sakai City (JP)

(72) Inventors: Masahiro Inuzuka, Sakai City (JP); Koji Yamabuchi, Sakai City (JP); Tohru Sonoda, Sakai City (JP); Tsuyoshi Inoue, Sakai City (JP); Junya Shimada, Sakai City (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 399 days.

(21) Appl. No.: 18/275,032

(22) PCT Filed: Feb. 15, 2021

(86) PCT No.: PCT/JP2021/005425
§ 371 (c)(1),
(2) Date: Jul. 31, 2023

(87) PCT Pub. No.: WO2022/172427
PCT Pub. Date: Aug. 18, 2022

(65) Prior Publication Data
US 2024/0324282 A1 Sep. 26, 2024

(51) Int. Cl.
*H10K 59/121* (2023.01)
*H10K 59/35* (2023.01)

(52) U.S. Cl.
CPC ......... *H10K 59/121* (2023.02); *H10K 59/353* (2023.02); *H10K 59/351* (2023.02)

(58) Field of Classification Search
CPC .. H10K 59/121; H10K 59/353; H10K 59/351; H10K 59/352; H10K 59/88; G09F 9/302
See application file for complete search history.

(56) References Cited

U.S. PATENT DOCUMENTS

| | | | |
|---|---|---|---|
| 2008/0018236 A1 | 1/2008 | Arai et al. | |
| 2017/0076654 A1 | 3/2017 | Wang | |
| 2017/0277219 A1* | 9/2017 | Chung | H04N 23/57 |
| 2020/0105843 A1 | 4/2020 | Baek et al. | |
| 2020/0308687 A1 | 10/2020 | Li et al. | |
| 2021/0407369 A1* | 12/2021 | Li | G09G 3/2074 |
| 2022/0102446 A1 | 3/2022 | Baek et al. | |

FOREIGN PATENT DOCUMENTS

| | | | | |
|---|---|---|---|---|
| JP | 2017-058671 A | 3/2017 | | |
| JP | 2019-526707 A | 9/2019 | | |
| JP | 2020-052394 A | 4/2020 | | |
| KR | 20220030380 A | * 3/2022 | | H10K 59/88 |
| WO | 2006027830 A1 | 3/2006 | | |
| WO | WO-2020259473 A1 | * 12/2020 | | G09G 3/3208 |

OTHER PUBLICATIONS

English Machine Translation of Yan . . . WO 2020 259 473 (Year: 2025).*
English Machine Translation of Kim, KR 2022 003 0380 (Year: 2025).*

* cited by examiner

*Primary Examiner* — Donald L Raleigh
(74) *Attorney, Agent, or Firm* — ScienBiziP, P.C.

(57) ABSTRACT

A display device includes, in a display area where an image is displayed, a plurality of pixels that emit light, the plurality of pixels including: a plurality of high-density pixels provided at a high density in the display area; and a plurality of low-density pixels provided at a lower density than the plurality of high-density pixels in the display area.

15 Claims, 17 Drawing Sheets

DISPLAY DEVICE

TECHNICAL FIELD

The present disclosure relates to display devices.

BACKGROUND ART

Published Japanese Translation of PCT Application, Tokuhyo, No. 2019-526707 discloses an OLED (organic light-emitting diode) substrate having a R aligning-use mating hole, a G aligning-use mating hole, and a B aligning-use mating hole in positions that are outside a pixel region where there is provided a plurality of pixels and that face aligning holes of a fine metal mask.

Upon placing the fine metal mask opposite the OLED substrate, the fine metal mask is adjusted in position so that the R aligning-use mating hole, the G aligning-use mating hole, or the B aligning-use mating hole of the OLED substrate overlaps the center of the aligning hole of the fine metal mask. An organic material is then patterned in the plurality of pixels in the pixel region of the OLED substrate via the fine metal mask.

SUMMARY

Technical Problem

In the OLED substrate of Published Japanese Translation of PCT Application, Tokuhyo, No. 2019-526707, the R aligning-use mating hole, the G aligning-use mating hole, and the B aligning-use mating hole, which are provided for the purpose of aligning with the fine metal mask, are located outside the pixel region and separated from the plurality of pixels in the pixel region in which an organic material is actually patterned via the fine metal mask. Therefore, in the OLED substrate of Published Japanese Translation of PCT Application, Tokuhyo, No. 2019-526707, it is difficult to further improve the precision of positioning relative to the fine metal mask. The present disclosure, in an aspect thereof, is to provide a display device that enables improving precision in positioning a patterning layer patterned using a mask.

Solution to Problem

The present disclosure, in one aspect thereof, is directed to a display device including, in a display area where an image is displayed, a plurality of pixels that emit light, the plurality of pixels including: a plurality of high-density pixels provided at a high density in the display area; and a plurality of low-density pixels provided at a lower density than the plurality of high-density pixels in the display area.

DESCRIPTION OF EMBODIMENTS

Embodiment

Figure 1:
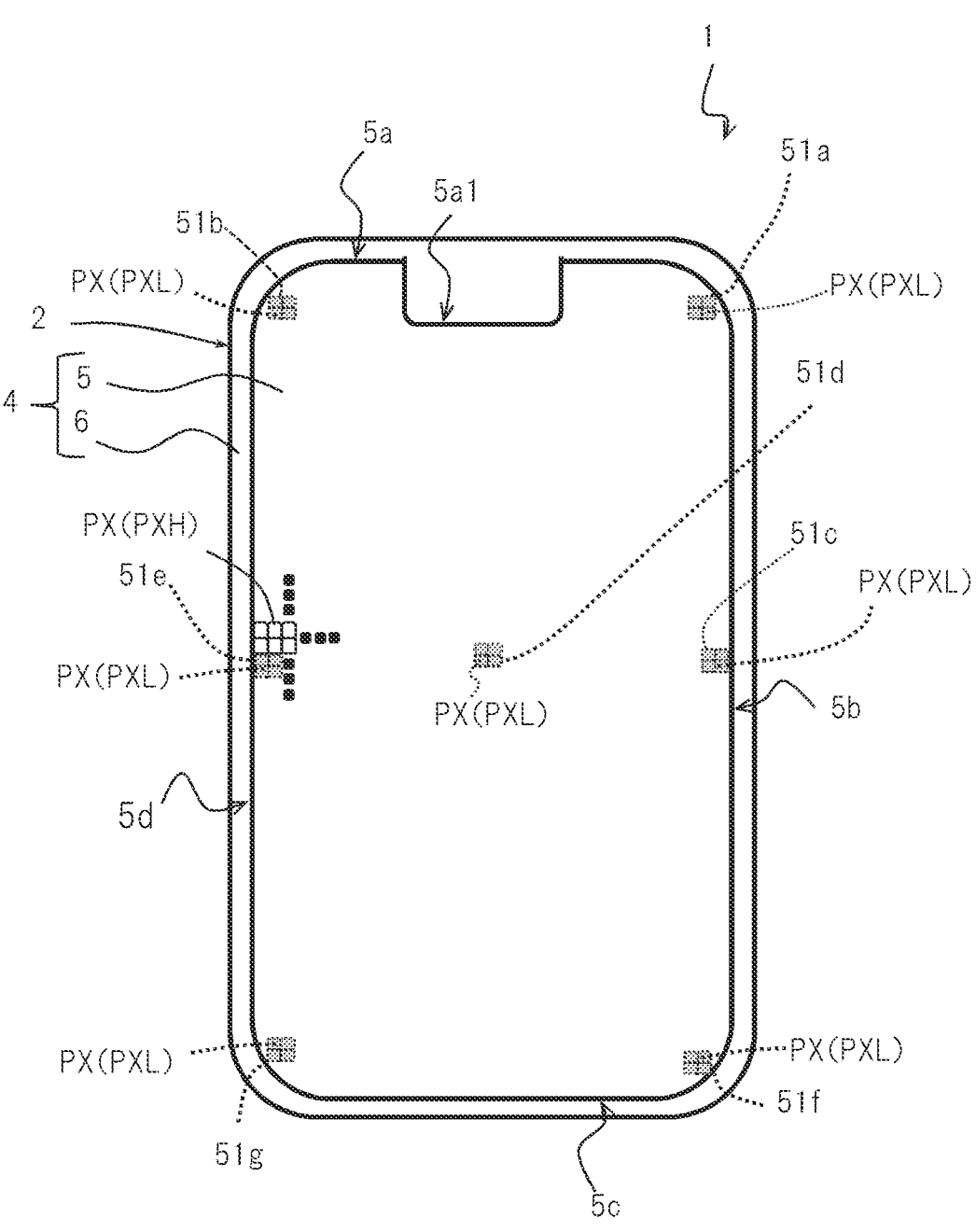
FIG. 1 is a schematic plan view of a structure of a display device in accordance with an embodiment.

FIG. 1 is a schematic plan view of a structure of a display device 1 in accordance with an embodiment. The display device 1 is an electronic apparatus, such as a mobile terminal, capable of producing images. An example of the display device 1 is a smartphone.

The display device 1 includes, for example, a display panel 4 and a housing 2 covering the sides and back of the display panel 4. The display panel 4 has an image display area 5 and a frame-shaped frame area 6 surrounding the display area 5. The display panel 4 needs only to be a display panel capable of producing images and may be, for example, a liquid crystal display panel, an OLED (organic light-emitting diode) display panel, an QLED (quantum dot light-emitting diode) display panel, or any other one of various display panels. Note that the display panel 4 is assumed to be, as an example, an OLED display panel in the present embodiment.

There is provided a matrix of light-emitting pixels PX in the display area 5. The light emitted by these pixels PX contributes to production of images on the display panel 4. No pixels PX are provided in, for example, the frame area 6.

In a plan view, the display area 5 is shaped, for example, like a rectangle with four curved corners and a notch 5*al* on one of the four sides. The notch 5*al* is a recess in the display area 5 toward the center thereof. Electronic devices such as a camera and a speaker may be provided in the frame area 6 outside the notch 5*al* in the display area 5.

The display area 5 is, for example, surrounded by a first side 5*a*, a second side 5*b*, a third side 5*c*, and a fourth side 5*d* that define the external shape. For example, the first side 5*a* and the third side 5*c* are shorter sides facing each other, and the second side 5*b* and the fourth side 5*d* are longer sides facing each other. The notch 5*al*, which is a recess in the display area 5 toward the center thereof, is provided approximately at the middle of the first side 5*a*. The first side 5*a*, the second side 5*b*, the third side 5*c*, and the fourth side 5*d* have curved, mutually connecting portions (i.e., the four corners of the display area 5). Each of the first side 5*a*, the second side 5*b*, the third side 5*c*, and the fourth side 5*d* of the display area 5 is a string of pixels PX disposed along an edge of the display area 5.

Note that the plan-view shape of the display area 5 and the plan-view shape of the display device 1 shown in FIG. 1 are mere examples. The display area 5 and the display device 1 may have other shapes.

The plurality of pixels PX include, in the display area 5: a plurality of high-density pixels PXH provided at a relatively high density; and a plurality of low-density pixels PXL provided at a relatively low density in comparison with the high-density pixels PXH. Both the plurality of high-density pixels PXH and the plurality of low-density pixels PXL emit light to produce images on the display area 5.

The plurality of high-density pixels PXH contribute to production of images on the display area 5. The plurality of low-density pixels PXL are fewer in number than the plurality of high-density pixels PXH, contribute to production of images on the display area 5, and also function as TEGs that serve as reference positions for determining the offset position of a mask in, for example, forming a layer that is patterned individually in each pixel PX (hereinafter, may be referred to as a "patterning layer") by patterning using a mask such as vapor deposition or printing. Note that examples of the patterning layer include a charge transport layer and a light-emitting layer.

In the display area 5 are there provided low-density regions 51*a* to 51*g* where the plurality of low-density pixels PXL are disposed. The low-density regions 51*a* to 51*g* are separated from each other in the display area 5. For example, the low-density regions 51*a* to 51*c* and 51*e* to 51*g* are provided in different locations on the edges of the display area 5. For example, the low-density region 51*d* is provided in the center of the display area 5 and surrounded by the plurality of high-density pixels PXH.

The patterning layer is easily displaced in patterning position in the center of the display area 5 particularly when the display panel 4 is used in, for example, a large television unit. Therefore, the provision of the low-density region 51*d* in the center of the display area 5 is highly effective particularly in restraining the displacement of the patterning layer across the entire display panel 4. In addition, the provision of the low-density regions 51*a*, 51*b*, 51*f*, and 51*g* on the four corners of the display area 5 enables further restraining the displacement of the patterning layer.

For example, the low-density regions 51*a*, 51*b*, 51*f*, and 51*g* are disposed on the respective curved corners of the display area 5. For example, in FIG. 1, the low-density region 51*a* is provided at the boundary between the first side 5*a* and the second side 5*b* of the display area 5 (on the upper right corner in FIG. 1), the low-density region 51*b* is provided at the boundary between the first side 5*a* and the fourth side 5*d* of the display area 5 (on the upper left corner in FIG. 1), the low-density region 51*f* is provided at the boundary between the second side 5*b* and the third side 5*c* of the display area 5 (on the lower right corner in FIG. 1), and the low-density region 51*g* is provided at the boundary between the third side 5*c* and the fourth side 5*d* of the display area 5 (on the lower left corner in FIG. 1).

For example, the low-density regions 51*c* and 51*e* are disposed on respectively different sides of the display area 5. For example, in FIG. 1, the low-density region 51*c* is provided on the second side 5*b*, which is a longer side of the display area 5, and the low-density region 51*e* is provided on the fourth side 5*d*, which is another longer side of the display area 5.

Note that the above-described locations of the low-density regions 51*a* to 51*d* in the display area 5 are mere examples. The low-density regions 51*a* to 51*d* need only to be provided in the display area 5 and may be provided in locations other than the locations shown in FIG. 1. In addition, the present embodiment focuses on examples where the plurality of low-density regions 51*a* to 51*d* are provided in the display area 5. However, the number of low-density regions in the display area 5 is at least one. The number of low-density regions in the display area 5 may be one.

Figure 2:
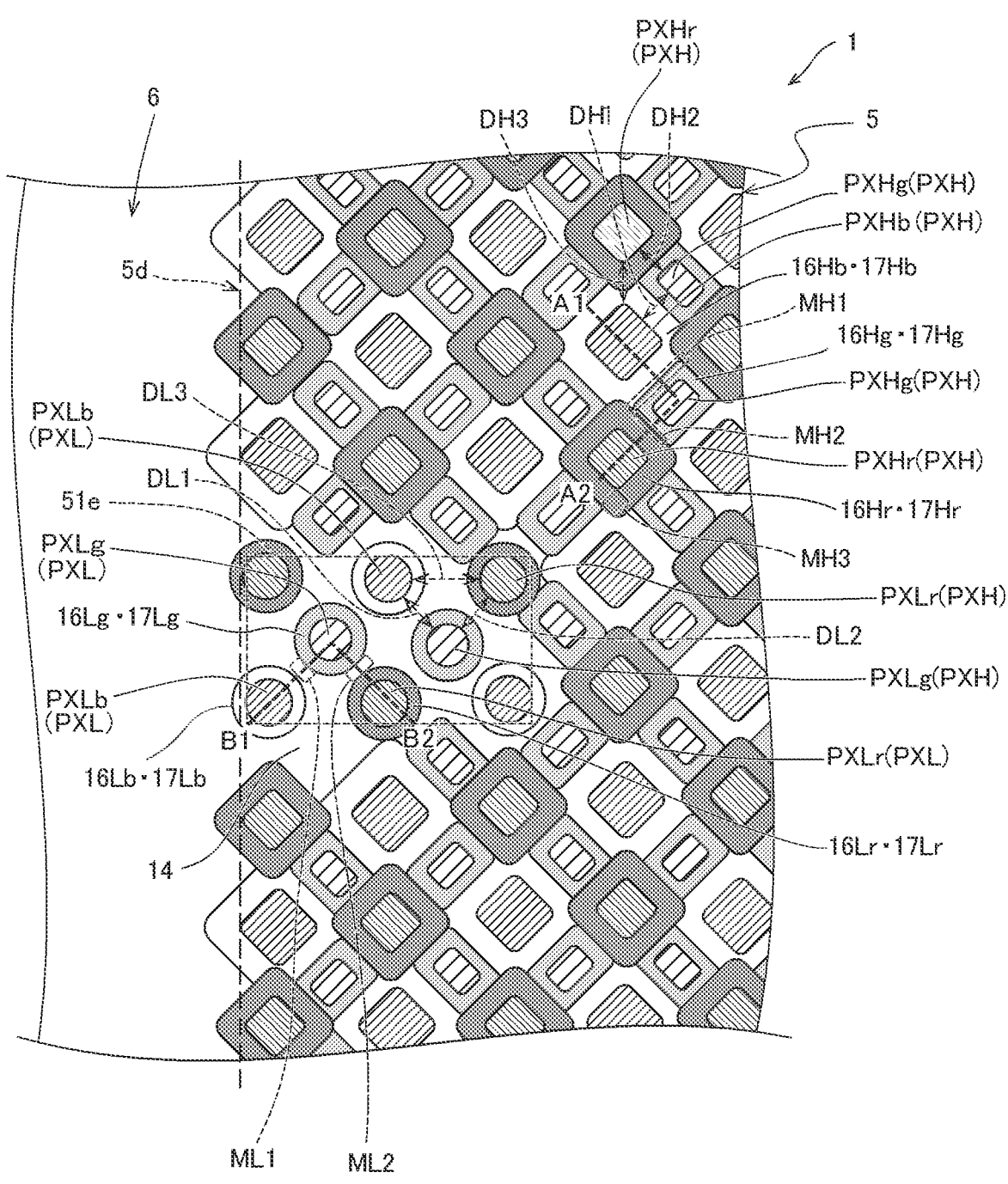
FIG. 2 is an enlarged plan view of a low-density region and a periphery of the low-density region of the display device shown in FIG. 1.

FIG. 2 is an enlarged plan view of the low-density region 51*e* and a periphery of the low-density region 51*e* of the display device 1 shown in FIG. 1. In FIG. 2, the fourth side 5*d*, which is an edge of the display area 5, is indicated by an imaginary line (broken line). The fourth side 5*d* is a line sequentially connecting the plurality of high-density pixels PXH and the plurality of low-density pixels PXL arranged adjacently on one of the edges of the display area 5.

Note that all the low-density regions 51*a* to 51*d*, 51*f*, and 51*g* shown in FIG. 1 have the same specific structure as the low-density region 51*e* except for the locations thereof in the display area 5, and description thereof is therefore omitted.

Referring to FIG. 2, for example, the plurality of high-density pixels PXH include, for example, a plurality of blue high-density pixels (first high-density pixels) PXHb that emit blue light (first color light), a plurality of green high-density pixels (second high-density pixels) PXHg that emit green light (second color light) which has a longer peak wavelength than the blue light, and a plurality of red high-density pixels (third high-density pixels) PXHr that emit red light (third color light) which has a longer peak wavelength than the green light.

Note that for example, the blue light has a peak wavelength of from 400 nm inclusive to 500 nm inclusive, the green light has a peak wavelength of from 500 nm exclusive to 600 nm inclusive, and the red light has a peak wavelength of from 600 nm exclusive to 780 nm inclusive.

At least one low-density pixel PXL is provided in the low-density region 51*e*. For example, the plurality of low-density pixels PXL are provided in the low-density region 51*e*. For example, the plurality of low-density pixels PXL include, similarly to the types of light emitted by the plurality of high-density pixels PXH, at least one blue low-density pixel (first low-density pixel) PXLb that emit the blue light (first color light), at least one green low-density pixel (second low-density pixel) PXLg that emit the green light (second color light) which has a longer peak wavelength than the blue light, and at least one red low-density pixel (third low-density pixel) PXLr that emit the red light (third color light) which has a longer peak wavelength than the green light.

In the example shown in FIG. 2, three blue low-density pixels PXLb, two green low-density pixels PXLg, and three red low-density pixels PXLr are provided in the low-density region 51e. Note that the numbers of the blue low-density pixels PXLb, the green low-density pixels PXLg, and the red low-density pixels PXLr in the low-density region 51e are not necessarily equal to the above-described numbers and may be all equal to one or more than one.

The adjacent blue, green, and red low-density pixels PXLb, PXLg, and PXLr, since being provided at a relatively low density in comparison with the adjacent blue, green, and red high-density pixels PXHb, PXHg, and PXHr, are such that the edges of the individually patterned patterning layers are unlikely to overlap.

In contrast, the adjacent blue, green, and red high-density pixels PXHb, PXHg, and PXHr, since being provided at a relatively high density in comparison with the adjacent blue, green, and red low-density pixels PXLb, PXLg, and PXLr, are such that the edges of the individually patterned patterning layers are likely to overlap.

Alternatively, the patterning layers patterned individually in the plurality of low-density pixels PXL may be described as having a smaller formation area than does the patterning layer patterned individually in the plurality of high-density pixels PXH.

Note that the red high-density pixels PXHr, the green high-density pixels PXHg, the blue high-density pixels PXHb, the red low-density pixels PXLr, the green low-density pixels PXLg, and the blue low-density pixels PXLb may be arranged in any array pattern. FIG. 2 shows an example where the red high-density pixels PXHr, the green high-density pixels PXHg, the blue high-density pixels PXHb, the red low-density pixels PXLr, the green low-density pixels PXLg, and the blue low-density pixels PXLb have a diamond PenTile arrangement. Alternatively, the red high-density pixels PXHr, the green high-density pixels PXHg, the blue high-density pixels PXHb, the red low-density pixels PXLr, the green low-density pixels PXLg, and the blue low-density pixels PXLb may be arranged in another array pattern.

For example, the red high-density pixels PXHr, the green high-density pixels PXHg, and the blue high-density pixels PXHb preferably share the same array pattern as the red low-density pixels PXLr, the green low-density pixels PXLg, and the blue low-density pixels PXLb.

This arrangement has a purpose of rendering it difficult for users to visually recognize not only the provision in the display area 5 of the plurality of high-density pixels PXH provided primarily for producing images, but also the provision in the display area 5 of the plurality of low-density pixels PXL that function for producing images and that also function as alignment-use TEGs for determining the offset position of a mask.

For example, the side that defines the low-density region 51e is a string of the plurality of low-density pixels PXL on an edge of the low-density region 51e. In the example shown in FIG. 2, the side that defines the low-density region 51e is indicated by an imaginary line (broken line) connecting the plurality of low-density pixels PXL together that make up a string of low-density pixels on an edge of the low-density region 51e.

For example, the low-density region 51e is surrounded by the high-density pixels PXH and the frame area 6. For example, the low-density region 51e has a side thereof overlapping the fourth side 5d of the display area 5.

Figure 3:
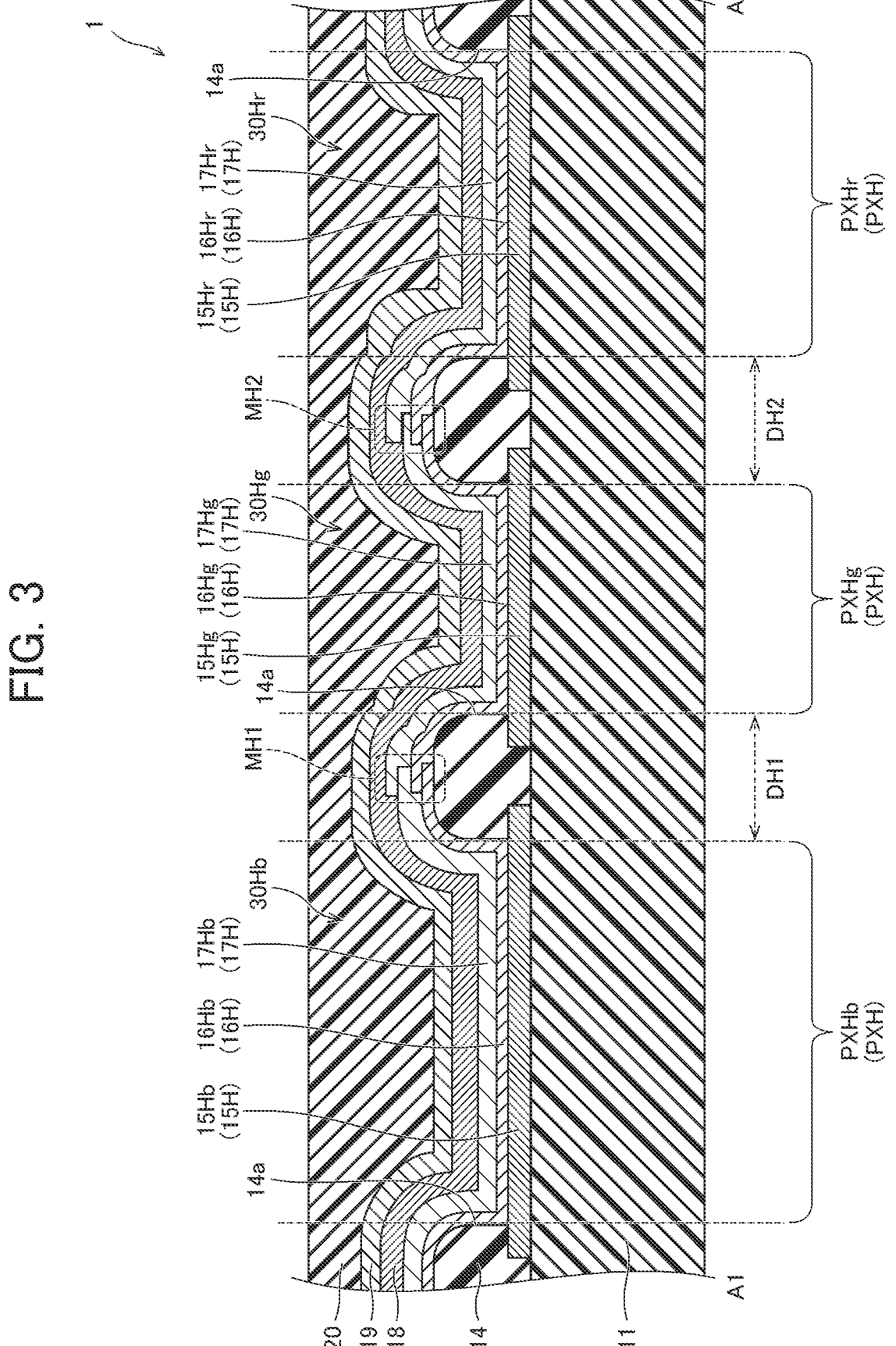
FIG. 3 is a cross-sectional view of the display device shown in FIG. 2, taken along line A1-A2.
Figure 4:
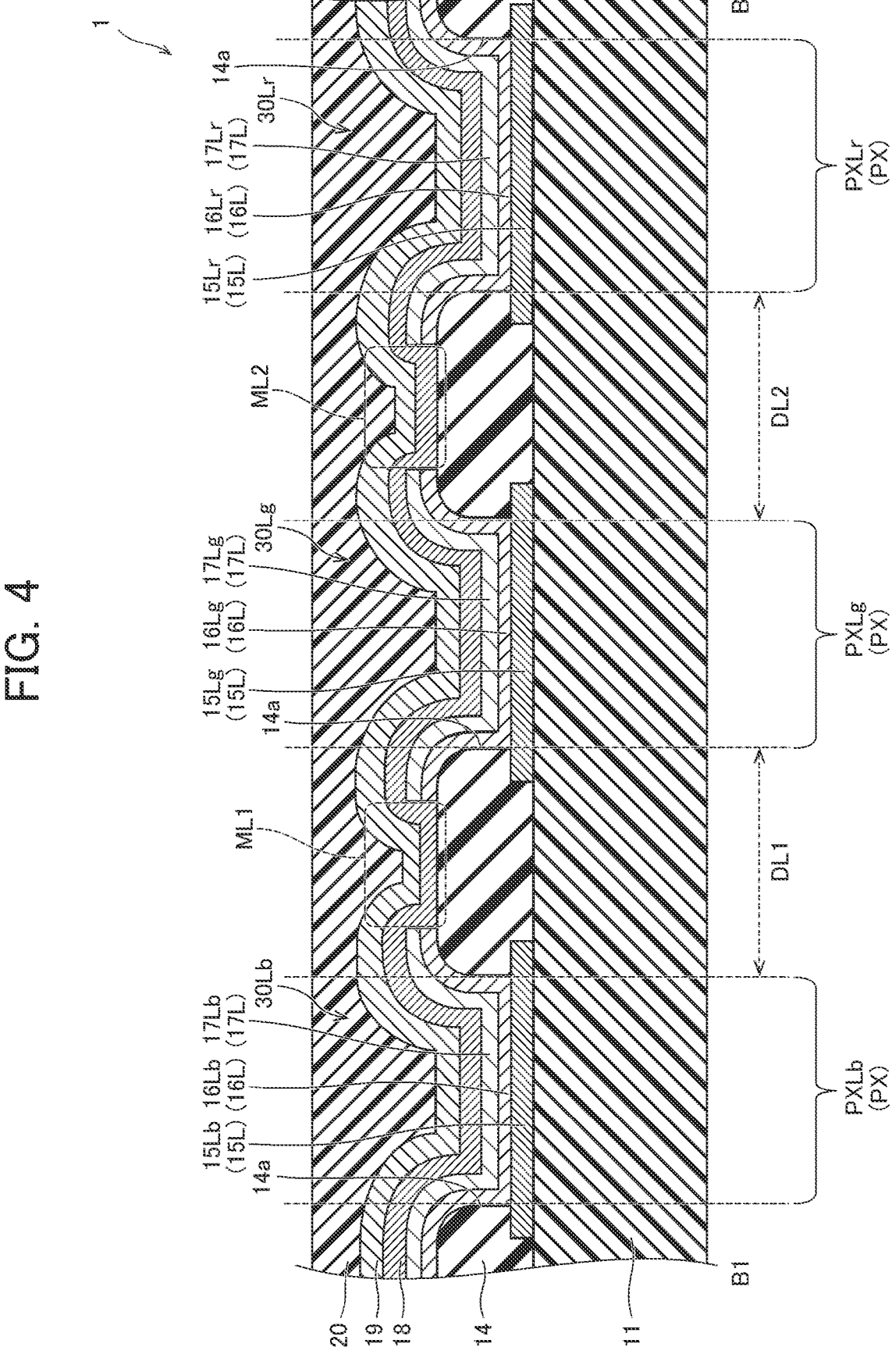
FIG. 4 is a cross-sectional view of the display device shown in FIG. 2, taken along line B1-B2.

FIG. 3 is a cross-sectional view of the display device 1 shown in FIG. 2, taken along line A1-A2. FIG. 4 is a cross-sectional view of the display device 1 shown in FIG. 2, taken along line B1-B2. In other words, FIG. 3 is a cross-section view of the plurality of high-density pixels PXH, and FIG. 4 is a cross-section view of the plurality of low-density pixels PXL.

Referring to FIG. 3, the display device 1 includes an array substrate 11, first electrodes 15Hb, 15Hg, and 15Hr, a bank 14, first charge transport layers (patterning layers) 16Hb, 16Hg, and 16Hr, light-emitting layers (patterning layers) 17Hb, 17Hg, and 17Hr, a second charge transport layer 18, a second electrode 19, and a sealing layer 20, all in a region where the high-density pixels PXH are provided.

Note that the first electrodes 15Hb, 15Hg, and 15Hr may be collectively referred to as the first electrodes 15H, the first charge transport layers 16Hb, 16Hg, and 16Hr as the first charge transport layer 16H, and the light-emitting layers 17Hb, 17Hg, and 17Hr as the light-emitting layer 17H.

For example, the first electrodes 15Hb, the first charge transport layers 16Hb, and the light-emitting layers 17Hb are provided like islands separated for each blue high-density pixel PXHb. For example, the first electrodes 15Hg, the first charge transport layers 16Hg, and the light-emitting layers 17Hg are provided like islands separated for each green high-density pixel PXHg. For example, the first electrodes 15Hr, the first charge transport layers 16Hr, and the light-emitting layers 17Hr are provided like islands separated for each red high-density pixel PXHr. The second charge transport layer 18, the second electrode 19, and the sealing layer 20 are provided as a common layer provided continuously across the blue high-density pixels PXHb, the green high-density pixels PXHg, and the red high-density pixels PXHr.

In addition, the first electrode 15Hb, the first charge transport layer 16Hb, the light-emitting layer 17Hb, the second charge transport layer 18, and the second electrode 19 in the blue high-density pixel PXHb are referred to as a light-emitting element 30Hb that emits blue light. In addition, the first electrode 15Hg, the first charge transport layer 16Hg, the light-emitting layer 17Hg, the second charge transport layer 18, and the second electrode 19 in the green high-density pixel PXHg are referred to as a light-emitting element 30Hg that emits green light. In addition, the first electrode 15Hr, the first charge transport layer 16Hr, the light-emitting layer 17Hr, the second charge transport layer 18, and the second electrode 19 in the red high-density pixel PXHr are referred to as a light-emitting element 30Hr that emits red light.

The bank 14 has formed therein openings 14a exposing the plurality of first electrodes 15H respectively. The light-emitting elements 30Hb are provided in the openings 14a in the bank 14 in which the first electrodes 15Hb are disposed. The light-emitting elements 30Hg are provided in the openings 14a in the bank 14 in which the first electrodes 15Hg are disposed. The light-emitting elements 30Hr are provided in the openings 14a in the bank 14 in which the first electrodes 15Hr are disposed.

Referring to FIG. 4, the display device 1 includes the array substrate 11, first electrodes 15Lb, 15Lg, and 15Lr, the bank 14, first charge transport layers (patterning layers) 16Lb, 16Lg, and 16Lr, light-emitting layers (patterning layers) 17Lb, 17Lg, and 17Lr, the second charge transport layer 18, the second electrode 19, and the sealing layer 20, all in a region where the low-density pixels PXL are provided.

Note that the first electrodes 15Lb, 15Lg, and 15Lr may be simply referred to as the first electrodes 15L, the first charge transport layers 16Lb, 16Lg, and 16Lr as the first charge transport layer 16L, and the light-emitting layers 17Lb, 17Lg, and 17Lr as the light-emitting layers 17L.

For example, the first electrodes 15Lb, the first charge transport layers 16Lb, and the light-emitting layers 17Lb are provided like islands separated for each blue low-density pixel PXLb. For example, the first electrodes 15Lg, the first charge transport layers 16Lg, and the light-emitting layers 17Lg are provided like islands separated for each green low-density pixel PXLg. For example, the first electrodes 15Lr, the first charge transport layers 16Lr, and the light-emitting layers 17Lr are provided like islands separated for each red low-density pixel PXLr. The second charge transport layer 18, the second electrode 19, and the sealing layer 20 are provided as a common layer provided continuously across the blue low-density pixels PXLb, the green low-density pixels PXLg, and the red low-density pixels PXLr and also across the blue high-density pixels PXHb, the green high-density pixels PXHg, and the red high-density pixels PXHr shown in FIG. 3.

In addition, the first electrode 15Lb, the first charge transport layer 16Lb, the light-emitting layer 17Lb, the second charge transport layer 18, and the second electrode 19 in the blue low-density pixel PXLb are referred to as a light-emitting element 30Lb that emits blue light. In addition, the first electrode 15Lg, the first charge transport layer 16Lg, the light-emitting layer 17Lg, the second charge transport layer 18, and the second electrode 19 in the green low-density pixel PXLg are referred to as a light-emitting element 30Lg that emits green light. In addition, the first electrode 15Lr, the first charge transport layer 16Lr, the light-emitting layer 17Lr, the second charge transport layer 18, and the second electrode 19 in the red low-density pixel PXLr are referred to as a light-emitting element 30Lr that emits red light.

The bank 14 has formed therein openings 14a exposing the plurality of first electrodes 15L respectively. The light-emitting elements 30Lb are provided in the openings 14a in the bank 14 in which the first electrodes 15Lb are disposed. The light-emitting elements 30Lg are provided in the openings 14a in the bank 14 in which the first electrodes 15Lg are disposed. The light-emitting elements 30Lr are provided in the openings 14a in the bank 14 in which the first electrodes 15Lr are disposed.

Referring to FIGS. 3 and 4, the array substrate 11 is continuous across the entire display panel 4 (see FIG. 1) including the regions where the plurality of high-density pixels PXH and the plurality of low-density pixels PXL are provided. The array substrate 11 includes, for example: a flexible base member; an inorganic insulating layer stacked on the base member; a plurality of TFTs (thin film transistors) and various wiring provided on the inorganic insulating layer; and an interlayer insulating layer stacked on the inorganic insulating layer so as to cover the plurality of TFTs.

The plurality of TFTs are switching elements for turning on/off driving of the plurality of pixels PX respectively (see FIG. 1). The plurality of TFTs are disposed in an array on the array substrate 11. The plurality of TFTs are provided respectively for the plurality of pixels PX (see FIG. 1).

The flexible base member includes, for example, an organic insulating material such as a polyimide. The inorganic insulating layer has either a monolayer structure or a multilayer structure and contains, for example, silicon oxide, silicon nitride, or silicon oxynitride. The interlayer insulating layer contains, for example, an organic insulating material such as a polyimide or an acrylic-based material. Hence, the flexible array substrate 11 can be structured. Note that the array substrate 11 may include, in place of the flexible base member, a rigid base member containing glass or a like inorganic insulating material.

The bank 14 and the first electrodes 15H and 15L are provided on the array substrate 11. The bank 14 is provided between the adjacent light-emitting elements 30Hb, 30Hg, 30Hr, 30Lb, 30Lg, and 30Lr. In other words, the bank 14 separates the adjacent light-emitting elements 30Hb, 30Hg, 30Hr, 30Lb, 30Lg, and 30Lr from each other. The bank 14 contains, for example, an insulating material such as a polyimide or an acrylic. For example, the bank 14 covers the edges of the plurality of first electrodes 15H and 15L, but may not cover these edges.

In the present embodiment, for example, all the light-emitting elements 30Hb and 30Lb, the light-emitting elements 30Hg and 30Lg, and the light-emitting elements 30Hr and 30Lr emit light by "electroluminescence" (EL) where the light-emitting layers 17H and 17L in the light-emitting elements 30Hb and 30Lb, the light-emitting elements 30Hg and 30Lg, and the light-emitting elements 30Hr and 30Lr emit light owing to a current flow between the first electrodes 15H and 15L and the second electrode 19.

For example, the first electrodes 15H and 15L are anodes and reflective electrodes. In addition, for example, the first charge transport layers 16H and 16L are hole transport layers. In addition, for example, the second charge transport layer 18 is an electron transport layer. In addition, for example, the second electrode 19 is a cathode and a transparent electrode.

Note that the first electrodes 15H and 15L may be cathodes and reflective electrodes, and the second electrode 19 may be an anode and a transparent electrode. In such a case, the first charge transport layers 16H and 16L are electron transport layers, and the second charge transport layer 18 is a hole transport layer.

The reflective electrodes that constitute the first electrodes 15H and 15L may be made using, for example, a reflective metal layer that exhibits a high reflectance to visible light. The reflective metal layer with a high reflectance to visible light includes, for example, a metal such as Al, Cu, Au, or Ag.

In addition, the first electrodes 15H and 15L may be each made using, in addition to a reflective metal layer, a transparent conductive layer that exhibits a high transmittance to visible light. The transparent conductive layer contains, for example, a transparent conductive material such as ITO (indium tin oxide), IZO (indium zinc oxide), ZnO (zinc oxide), AZO (aluminum-doped zinc oxide), or GZO (gallium-doped zinc oxide).

Each layer in the first electrodes 15H and 15L may be formed by, for example, sputtering or vapor deposition. For example, the first electrodes 15H and 15L are formed using the same material in the same step.

For example, in the light-emitting element 30Hb, the first electrode 15Hb injects holes to the first charge transport layer 16Hb, and the first charge transport layer 16Hb transports the injected holes to the light-emitting layer 17Hb. The first electrode 15Hb is connected to a TFT underlying the interlayer insulating layer in each light-emitting element 30Hb via a contact hole formed through the interlayer insulating layer on the array substrate 11 where the first electrode 15Hb is provided. For example, in the light-emitting element 30Hg, the first electrode 15Hg injects holes to the first charge transport layer 16Hg, and the first charge transport layer 16Hg transports the injected holes to the light-emitting layer 17Hg. The first electrode 15Hg is connected to a TFT underlying the interlayer insulating layer in each light-emitting element 30Hg via a contact hole formed through the interlayer insulating layer on the array substrate 11 where the first electrode 15Hg is provided. For example, in the light-emitting element 30Hr, the first electrode 15Hr injects holes to the first charge transport layer 16Hr, and the first charge transport layer 16Hb transports the injected holes to the light-emitting layer 17Hb. The first electrode 15Hr is connected to a TFT underlying the interlayer insulating layer in each light-emitting element 30Hr via a contact hole formed through the interlayer insulating layer on the array substrate 11 where the first electrode 15Hr is provided.

For example, in the light-emitting element 30Lb, the first electrode 15Lb injects holes to the first charge transport layer 16Lb, and the first charge transport layer 16Lb transports the injected holes to the light-emitting layer 17Lb. The first electrode 15Lb is connected to a TFT underlying the interlayer insulating layer in each light-emitting element 30Lb via a contact hole formed through the interlayer insulating layer on the array substrate 11 where the first electrode 15Lb is provided. For example, in the light-emitting element 30Lg, the first electrode 15Lg injects holes to the first charge transport layer 16Lg, and the first charge transport layer 16Lg transports the injected holes to the light-emitting layer 17Lg. The first electrode 15Lg is connected to a TFT underlying the interlayer insulating layer in each light-emitting element 30Lg via a contact hole formed through the interlayer insulating layer on the array substrate 11 where the first electrode 15Lg is provided. For example, in the light-emitting element 30Lr, the first electrode 15Lr injects holes to the first charge transport layer 16Lr, and the first charge transport layer 16Lr transports the injected holes to the light-emitting layer 17Lr. The first electrode 15Lr is connected to a TFT underlying the interlayer insulating layer in each light-emitting element 30Lr via a contact hole formed through the interlayer insulating layer on the array substrate 11 where the first electrode 15Lr is provided.

The first charge transport layer 16Hb is provided between the first electrode 15Hb and the light-emitting layer 17Hb. The first charge transport layer 16Lb is provided between the first electrode 15Lb and the light-emitting layer 17Lb. The first charge transport layer 16Hg is provided between the first electrode 15Hg and the light-emitting layer 17Hg. The first charge transport layer 16Lg is provided between the first electrode 15Lg and the light-emitting layer 17Lg. The first charge transport layer 16Hr is provided between the first electrode 15Hr and the light-emitting layer 17Hr. The first charge transport layer 16Lr is provided between the first electrode 15Lr and the light-emitting layer 17Lr.

The first charge transport layers 16H and 16L contain, for example, a hole transport material. The first charge transport layers 16H and 16L may contain, for example, PEDOT:PSS (polyethylenedioxythiophene/polystyrene sulfonate), PVK (poly-N-vinyl carbazole), TFB (poly[(9,9-dioctylfluorenyl-2,7-diyl)-co-(4,4'-(N-(4-sec-butylphenyl)diphenyl amine))]), or poly-TPD (N,N'-bis(4-butylphenyl)-N,N'-bis(phenyl)-benzidine) or may contain two or more of these materials.

For example, the first charge transport layers 16Hb and 16Lb are formed using the same material in the same step using the same mask. The first charge transport layers 16Hb and 16Lb are patterning layers that are patterned by a patterning method such as vapor deposition or printing using a mask in which the same array pattern of mask openings as the array pattern of the blue high-density pixels PXHb and the blue low-density pixels PXLb is formed.

For example, the first charge transport layers 16Hg and 16Lg are formed using the same material in the same step using the same mask. The first charge transport layers 16Hg and 16Lg are patterning layers that are patterned by a patterning method such as vapor deposition or printing using a mask in which the same array pattern of mask openings as the array pattern of the green high-density pixels PXHg and the green low-density pixels PXLg is formed.

For example, the first charge transport layers 16Hr and 16Lr are formed using the same material in the same step using the same mask. The first charge transport layers 16Hr and 16Lr are patterning layers that are patterned by a patterning method such as vapor deposition or printing using a mask in which the same array pattern of mask openings as the array pattern of the red high-density pixels PXHr and the red low-density pixels PXLr is formed.

The first charge transport layers 16H and 16L may be provided not only in the openings 14a in the bank 14, but may have larger areas than the openings 14a in the bank 14 in a plan view and have the edges thereof formed on the bank 14.

Here, the first charge transport layers 16Hb and 16Lb, the first charge transport layers 16Hg and 16Lg, and the first charge transport layers 16Hr and 16Lr are sequentially patterned using respectively different masks.

For example, the first charge transport layers 16Hb and 16Lb, the first charge transport layers 16Hg and 16Lg, and the first charge transport layers 16Hr and 16Lr glow under UV (ultraviolet) light, which enables identifying the positions where these layers are patterned. Accordingly, among the first charge transport layers 16Hb and 16Lb, the first charge transport layers 16Hg and 16Lg, and the first charge transport layers 16Hr and 16Lr, those first charge transport layers that are patterned before the others are irradiated with UV light to adjust the alignment position of the mask for those first charge transport layers that are subsequently patterned.

However, since the plurality of high-density pixels PXH are provided at a high density as described above, the first charge transport layer that is patterned after another first charge transport layer may have an edge thereof overlapping, on the bank 14 between the adjacent high-density pixels PXH, the edge of that earlier patterned, first charge transport layer that is extended onto the bank 14. In such a case, it is difficult to identify the edge of the later patterned, first charge transport layer, and it is difficult to identify the positions where the later patterned, first charge transport layer is patterned.

For example, in a region MH1 shown in FIGS. 2 and 3, among the adjacent blue and green high-density pixels PXHb and PXHg, the first charge transport layer 16Hb patterned earlier in the blue high-density pixel PXHb has an edge thereof formed extended also onto the bank 14, and the first charge transport layer 16Hg patterned later in the green high-density pixel PXHg has an edge thereof overlapping the edge of the first charge transport layer 16Hb that is extended onto the bank 14.

For example, in a region MH2, among the adjacent green and red high-density pixels PXHg and PXHr, the first charge transport layer 16Hg patterned earlier in the green high-density pixel PXHg has an edge thereof formed extended also onto the bank 14, and the first charge transport layer 16Hr patterned later in the red high-density pixel PXHr has an edge thereof overlapping the edge of the first charge transport layer 16Hg that is extended onto the bank 14.

In contrast, since the plurality of low-density pixels PXL are provided at a low density, the edge of the earlier patterned, first charge transport layer that is extended onto the bank 14 and the edge of the later patterned, first charge transport layer can be restrained from overlapping on the bank 14 between the adjacent low-density pixels PXL. Therefore, it is easy to identify the edge of the later patterned, first charge transport layer, and it is easy to identify the positions where the later patterned, first charge transport layer is patterned.

For example, in a region ML1 shown in FIGS. 2 and 4, among the adjacent blue and green low-density pixels PXLb and PXLg, the first charge transport layer 16Lb patterned earlier in the blue low-density pixel PXLb has an edge thereof formed extended also onto the bank 14, and the first charge transport layer 16Lg patterned later in the green low-density pixel PXLg has an edge thereof formed extended onto the bank 14. However, minimum distance DL1 is longer than minimum distance DH1, and for this reason, the neighborhood of the edge of the first charge transport layer 16Lb extended onto the bank 14 is separated from, and does not overlap, the edge of the first charge transport layer 16Lb.

For example, in a region ML2, among the adjacent green and red low-density pixels PXLg and PXLr, the first charge transport layer 16Lg patterned earlier in the green low-density pixel PXLg has an edge thereof formed extended also onto the bank 14, and the first charge transport layer 16Lr patterned later in the red low-density pixel PXLr has an edge thereof formed extended onto the bank 14. However, minimum distance DL2 is longer than minimum distance DH2, and for this reason, the edge of the first charge transport layer 16Lg extended onto the bank 14 is separated from, and does not overlap, the edge of the first charge transport layer 16Lr.

As described here, since the blue low-density pixels PXLb, the green low-density pixels PXLg, and the red low-density pixels PXLr are provided at a low density, the edges of the first charge transport layers 16Lb, 16Lg, and 16Lr are unlikely to overlap each other between the adjacent low-density pixels PXL. Therefore, a worker or a position acquisition device can easily identify the positions of the edges of the first charge transport layers 16Lb, 16Lg, and 16Lr from microscopy images and easily and accurately identify the positions where the first charge transport layers 16Lb, 16Lg, and 16Lr are patterned (e.g., the locations of the centers thereof) from the identified edges.

Hence, even when the blue low-density pixels PXLb, the green low-density pixels PXLg, and the red low-density pixels PXLr are disposed in the display area 5, the displacement amounts between the locations of the blue low-density pixels PXLb, the green low-density pixels PXLg, and the red low-density pixels PXLr and the locations of the individually patterned, first charge transport layers 16Lb, 16Lg, and 16Lr can be acquired.

Then, the offset positions of masks used in patterning the first charge transport layers 16Lb, 16Lg, and 16Lr respectively can be adjusted on the basis of the acquired displacement amounts.

In other words, the blue low-density pixels PXLb provided at a low density can function not only as the pixels PX, but also as TEGs that serve as reference positions for determining the offset position of a mask in patterning the first charge transport layers 16Lb in the blue low-density pixels PXLb and the blue high-density pixels PXHb. In addition, the green low-density pixels PXLg provided at a low density can function not only as the pixels PX, but also as TEGs that serve as reference positions for determining the offset position of a mask in patterning the first charge transport layers 16Lg in the green low-density pixels PXLg and the green high-density pixels PXHg. In addition, the red low-density pixels PXLr provided at a low density can function not only as the pixels PX, but also as TEGs that serve as reference positions for determining the offset position of a mask in patterning the first charge transport layers 16Lr in the red low-density pixels PXLr and the red high-density pixels PXHr.

As described here, the display device 1 enables determining the offset positions of masks in patterning the first charge transport layers 16Hb and 16Lb, the first charge transport layers 16Hg and 16Lg, and the first charge transport layers 16Hr and 16Lr respectively by using, as references, the blue low-density pixels PXLb, the green low-density pixels PXLg, and the red low-density pixels PXLr which are provided in the display area 5. Therefore, in comparison with when a TEG that serves as a reference for determining the offset positions of masks is provided outside the display area and separated from the display area, the display device 1 enables patterning the first charge transport layers 16Hb and 16Lb, the first charge transport layers 16Hg and 16Lg, and the first charge transport layers 16Hr and 16Lr in accurate locations across the entire display area 5, thereby restraining patterning these first charge transport layers exceedingly into the adjacent pixels PX.

The light-emitting layer 17Hb is provided between the first electrode 15Hb and the second electrode 19, specifically, between the first charge transport layer 16Hb and the second charge transport layer 18. The light-emitting layer 17Lb is provided between the first electrode 15Lb and the second electrode 19, specifically, between the first charge transport layer 16Lb and the second charge transport layer 18. The light-emitting layer 17Hg is provided between the first electrode 15Hg and the second electrode 19, specifically, between the first charge transport layer 16Hg and the second charge transport layer 18. The light-emitting layer 17Lg is provided between the first electrode 15Lg and the second electrode 19, specifically, between the first charge transport layer 16Lg and the second charge transport layer 18. The light-emitting layer 17Hr is provided between the first electrode 15Hr and the second electrode 19, specifically, between the first charge transport layer 16Hr and the second charge transport layer 18. The light-emitting layer 17Lr is provided between the first electrode 15Lr and the second electrode 19, specifically, between the first charge transport layer 16Lr and the second charge transport layer 18.

The light-emitting layers 17Hb and 17Lb contain an organic light-emitting material that emits blue light. The light-emitting layers 17Hg and 17Lg contain an organic light-emitting material that emits green light. The light-emitting layers 17Hr and 17Lr contain an organic light-emitting material that emits red light.

Note that the light-emitting layers 17Hb and 17Lb may contain quantum dots that are blue light-emitting semiconductor nanoparticles in place of the organic light-emitting material that emits blue light. In addition, the light-emitting layers 17Hg and 17Lg may contain quantum dots that are green light-emitting semiconductor nanoparticles in place of the organic light-emitting material that emits green light. In addition, the light-emitting layers 17Hr and 17Lr may contain quantum dots that are red light-emitting semiconductor nanoparticles in place of the organic light-emitting material that emits red light.

For example, the light-emitting layers 17Hb and 17Lb, which emit light of the same color (blue light), are formed using the same material in the same step using the same mask. The light-emitting layers 17Hb and 17Lb are patterning layers that are patterned by a patterning method such as vapor deposition or printing using a mask in which the same array pattern of mask openings as the array pattern of the blue high-density pixels PXHb and the blue low-density pixels PXLb is formed.

For example, the light-emitting layers 17Hg and 17Lg, which emit light of the same color (green light), are formed using the same material in the same step using the same mask. The light-emitting layers 17Hg and 17Lg are patterning layers that are patterned by a patterning method such as vapor deposition or printing using a mask in which the same array pattern of mask openings as the array pattern of the green high-density pixels PXHg and the green low-density pixels PXLg is formed.

For example, the light-emitting layers 17Hr and 17Lr, which emit light of the same color (red light), are formed using the same material in the same step using the same mask. The light-emitting layers 17Hr and 17Lr are patterning layers that are patterned by a patterning method such as vapor deposition or printing using a mask in which the same array pattern of mask openings as the array pattern of the red high-density pixels PXHr and the red low-density pixels PXLr is formed.

The light-emitting layers 17H and 17L may be not only provided in the openings 14a in the bank 14, but have a larger area than the openings 14a in the bank 14 in a plan view and have an edge thereof formed on the bank 14 or on the first charge transport layers 16H and 16L formed on the bank 14 respectively.

Here, the light-emitting layers 17Hb and 17Lb, the light-emitting layers 17Hg and 17Lg, and the light-emitting layers 17Hr and 17Lr are sequentially patterned using respectively different masks.

In addition, similarly to the first charge transport layers, for example, the light-emitting layers 17Hb and 17Lb, the light-emitting layers 17Hg and 17Lg, and the light-emitting layers 17Hr and 17Lr glow under UV light, which enables identifying the positions where these layers are patterned. Accordingly, among the light-emitting layers 17Hb and 17Lb, the light-emitting layers 17Hg and 17Lg, and the light-emitting layers 17Hr and 17Lr, those light-emitting layers that are patterned before the others are irradiated with UV light to adjust the alignment position of the mask for those light-emitting layers that are subsequently patterned.

However, since the plurality of high-density pixels PXH are provided at a high density as described above, the light-emitting layer that is patterned after another light-emitting layer may have an edge thereof overlapping, on the bank 14 between the adjacent high-density pixels PXH, the edge of that earlier patterned light-emitting layer that is extended onto the bank 14. Therefore, it is difficult to identify the positions where the light-emitting layer is patterned on the basis of the location of the edge.

For example, in the region MH1 shown in FIGS. 2 and 3, among the adjacent blue and green high-density pixels PXHb and PXHg, the light-emitting layer 17Hb patterned earlier in the blue high-density pixel PXHb has an edge thereof formed extended also onto the bank 14 (e.g., onto the neighborhood of the edge of the first charge transport layer 16Hg), and the light-emitting layer 17Hg patterned later in the green high-density pixel PXHg has an edge thereof overlapping the edge of the light-emitting layer 17Hb that is extended onto the bank 14.

For example, in the region MH2, among the adjacent green and red high-density pixels PXHg and PXHr, the light-emitting layer 17Hg patterned earlier in the green high-density pixel PXHg has an edge thereof formed extended also onto the bank 14 (e.g., onto the neighborhood of the edge of the first charge transport layer 16Hr), and the light-emitting layer 17Hr patterned later in the red high-density pixel PXHr has an edge thereof overlapping the edge of the light-emitting layer 17Hg extended onto the bank 14.

In contrast, since the plurality of low-density pixels PXL are provided at a low density, the edge of the earlier patterned light-emitting layer that is extended onto the bank 14 and the edge of the later patterned light-emitting layer can be restrained from overlapping on the bank 14 between the adjacent low-density pixels PXL. Therefore, it is easy to identify the edge of the later patterned light-emitting layer, and it is easy to identify the positions where the later patterned light-emitting layer is patterned.

For example, in the region ML1 shown in FIGS. 2 and 4, among the adjacent blue and green low-density pixels PXLb and PXLg, the light-emitting layer 17Lb patterned earlier in the blue low-density pixel PXLb has an edge thereof formed extended also onto the bank 14 (e.g., onto the neighborhood of the edge of the first charge transport layer 16Lb), and the light-emitting layer 17Lg patterned later in the green low-density pixel PXLg has an edge thereof formed extended onto the bank 14 (e.g., onto the neighborhood of the edge of the first charge transport layer 16Lg). However, minimum distance DL1 is longer than minimum distance DH1, and for this reason, the edge of the light-emitting layer 17Lg extended onto the bank 14 is separated from, and does not overlap, the neighborhood of the edge of the light-emitting layer 17Lb or the edge of the first charge transport layer 16Lb.

For example, in the region ML2, among the adjacent green and red low-density pixels PXLg and PXLr, the light-emitting layer 17Lg patterned earlier in the green low-density pixel PXLg has an edge thereof formed extended also onto the bank 14 (e.g., onto the neighborhood of the edge of the first charge transport layer 16Lg), and the light-emitting layer 17Lr patterned later in the red low-density pixel PXLr has an edge thereof formed extended onto the bank 14 (e.g., onto the neighborhood of the edge of the first charge transport layer 16Lr). However, minimum distance DL2 is longer than minimum distance DH2, and for this reason, the edge of the light-emitting layer 17Lr extended onto the bank 14 is separated from, and does not overlap, the neighborhood of the edge of the light-emitting layer 17Lg or the edge of the first charge transport layer 16Lg.

As described here, since the blue low-density pixels PXLb, the green low-density pixels PXLg, and the red low-density pixels PXLr are provided at a low density, the edges of the light-emitting layers 17Lb, 17Lg, and 17Lr are unlikely to overlap each other between the adjacent low-density pixels.

Therefore, a worker or device can easily identify the edges of the light-emitting layers 17Lb, 17Lg, and 17Lr from microscopy images and easily and accurately identify the positions where the light-emitting layers 17Lb, 17Lg, and 17Lr are patterned (e.g., the locations of the centers thereof) from the identified edges.

Hence, even when the blue low-density pixels PXLb, the green low-density pixels PXLg, and the red low-density pixels PXLr are disposed in the display area 5, the displacement amounts between the locations of the blue low-density pixels PXLb, the green low-density pixels PXLg, and the red low-density pixels PXLr and the locations of the individually patterned light-emitting layers 17Lb, 17Lg, and 17Lr can be acquired. Then, the offset positions of masks used in patterning the light-emitting layers 17Lb, 17Lg, and 17Lr respectively can be adjusted on the basis of the acquired displacement amounts.

As described here, the display device 1 enables determining the offset positions of masks in patterning the light-emitting layers 17Hb and 17Lb, the light-emitting layers 17Hg and 17Lg, and the light-emitting layers 17Hr and 17Lr by using, as references, the blue low-density pixels PXLb, the green low-density pixels PXLg, and the red low-density pixels PXLr which are provided in the display area 5. Therefore, in comparison with when a TEG that serves as a reference for determining the offset positions of masks is provided outside the display area and separated from the display area, the display device 1 enables patterning the light-emitting layers 17Hb and 17Lb, the light-emitting layers 17Hg and 17Lg, and the light-emitting layers 17Hr and 17Lr in accurate locations across the entire display area 5, thereby restraining patterning these light-emitting layers exceedingly into the adjacent pixels PX.

The second charge transport layer 18 is, for example, an electron transport layer. In the light-emitting element 30Hb, the second charge transport layer 18 transports the electrons injected from the second electrode 19 to the light-emitting layer 17Hb. In the light-emitting element 30Lb, the second charge transport layer 18 transports the electrons injected from the second electrode 19 to the light-emitting layer 17Lb. In the light-emitting element 30Hg, the second charge transport layer 18 transports the electrons injected from the second electrode 19 to the light-emitting layer 17Hg. In the light-emitting element 30Lg, the second charge transport layer 18 transports the electrons injected from the second electrode 19 to the light-emitting layer 17Lg. In the light-emitting element 30Hr, the second charge transport layer 18 transports the electrons injected from the second electrode 19 to the light-emitting layer 17Hr. In the light-emitting element 30Lr, the second charge transport layer 18 transports the electrons injected from the second electrode 19 to the light-emitting layer 17Lr.

The second charge transport layer 18 contains, for example, a plurality of electron-transporting nanoparticles. The second charge transport layer 18 may be formed by, for example, coating or inkjet printing.

Note that the second charge transport layer 18 may have a function of restraining holes from being transported from the light-emitting layers 17H and 17L to the second electrode 19 (hole blocking function). The second charge transport layer 18 is continuous across each of the entire light-emitting layers 17H and 17L and provided also on the bank 14. Note that the second charge transport layer 18 may be provided separately for each of the light-emitting elements 30Hb, the light-emitting elements 30Lb, the light-emitting elements 30Hg, the light-emitting elements 30Lg, the light-emitting elements 30Hr, and the light-emitting elements 30Lr.

The second electrode 19 injects electrons to the second charge transport layer 18. The second electrode 19 is provided continuously also on the second charge transport layer 18 and on the second charge transport layer 18 on the bank 14. For example, the second electrode 19 is a common electrode provided continuously across the light-emitting elements 30Hb, the light-emitting elements 30Lb, the light-emitting elements 30Hg, the light-emitting elements 30Lg, the light-emitting elements 30Hr, and the light-emitting elements 30Lr.

The transparent electrode that constitutes the second electrode 19 exhibits a high transmittance to visible light. The transparent electrode with a high transmittance to visible light may be made of, for example, ITO, IZO, ZnO, AZO, or GZO. In addition, the transparent electrode may be formed by, for example, sputtering or vapor deposition.

In addition, the sealing layer 20 is provided on the second electrode 19. For example, the sealing layer 20 includes: a first inorganic sealing layer covering the second electrode 19; an organic buffer layer stacked overlying the first inorganic sealing layer; and a second inorganic sealing layer stacked overlying the organic buffer layer. The sealing layer 20 prevents permeation into the display device 1 of water, oxygen, and other foreign objects.

The first inorganic sealing layer and the second inorganic sealing layer may each have either a monolayer structure including an inorganic insulating material such as a silicon oxide layer, a silicon nitride layer, or a silicon oxynitride layer or a multilayer structure including a combination of these layers. The first inorganic sealing layer and the second inorganic sealing layer may each be formed by, for example, CVD.

The organic buffer layer is a transparent resin layer that has a planarization effect and that transmits, for example, visible light. The organic buffer layer may be made of an organic material, such as an acrylic, that can be provided by printing or coating technology. In addition, there may be provided a functional film (not shown) on the sealing layer. The functional film may have, for example, at least one of an optical compensation function, a touch sensor function, and a protection function.

For example, the display device 1 is a top-emission type where the light emitted by the light-emitting layers 17H and 17L is passed through the second charge transport layer 18 and the second electrode 19 and extracted to the opposite side from the array substrate 11 (the top side from the light-emitting layers 17H and 17L in FIGS. 3 and 4). Note that the display device 1 may be a bottom-emission type where the light emitted by the light-emitting layers 17H and 17L is passed through the first charge transport layers 16H and 16L, the first electrodes 15H and 15L, and the array substrate 11 and extracted to the array substrate 11 side (the bottom side from the light-emitting layers 17H and 17L in FIGS. 3 and 4). When the display device 1 is a bottom-emission type, the second electrode 19 includes a reflective metal layer with a high reflectance to visible light, and the first electrodes 15H and 15L include a transparent conductive layer with a high transmittance to visible light.

Note that the layered structure of each of the light-emitting elements 30Hb and 30Lb, the light-emitting elements 30Hg and 30Lg, and the light-emitting elements 30Hr and 30Lr is not limited to the structure shown in FIGS. 3 and 4 and may include another functional layer, for example, a hole injection layer for increasing the efficiency of hole injection or an electron injection layer for increasing the efficiency of electron injection.

Referring to FIGS. 2 to 4, the plurality of pixels PX in the display device 1 include: the plurality of high-density pixels PXH provided at a high density in the display area 5; and the plurality of low-density pixels PXL provided at a lower density than the plurality of high-density pixels PXH in the display area 5.

Since the plurality of low-density pixels PXL are provided at a low density in comparison with the plurality of high-density pixels PXH, the edges of the patterning layers patterned individually in each of the plurality of pixels PX using masks (e.g., the first charge transport layers 16Lb, 16Lg, and 16Lr and the light-emitting layers 17Lb, 17Lg, and 17Lr) can be restrained from overlapping between the adjacent low-density pixels PXL.

Therefore, for example, when the positions of the patterning layers acquired through microscope are acquired by a worker or a position acquisition device, the edges of the patterning layers (the first charge transport layers 16Lb, 16Lg, and 16Lr and the light-emitting layers 17Lb, 17Lg, and 17Lr) are easily identified, and hence the positions of the patterning layers can be more accurately identified and acquired from the identified edges by further restraining variations between the individual patterning layers.

Therefore, the displacement amounts between the positions of the low-density pixels PXL and the positions where the patterning layers are patterned can be more accurately acquired by, for example, a worker or a position acquisition device. Therefore, the plurality of low-density pixels PXL can function not only as some of the plurality of pixels PX, but also as TEGs that serve as references for determining the offset position of a mask for the patterning layer in individually patterning the plurality of pixels PX.

In addition, the low-density pixels PXL, which function also as TEGs, are provided in the display area 5 and therefore at close distance to the pixels PX. In other words, the low-density pixels PXL are some of the plurality of pixels PX provided in the display area 5. Therefore, in comparison with when a TEG that serves as a reference for determining the offset positions of masks is provided outside the display area and away from the display area, the display device 1 enables patterning the patterning layers (e.g., the first charge transport layers 16Hb and 16Lb, 16Hg and 16Lg, 16Hr and 16Lr and the light-emitting layers 17Hb and 17Lb, 17Hg and 17Lg, 17Hr and 17Lr) patterned individually in each of the plurality of pixels PX in accurate locations across the entire display area 5, thereby restraining patterning these patterning layers exceedingly into the adjacent pixels PX. In other words, the display device 1 can improve the positional precision of the patterning layers across the entire display panel 4.

In addition, for example, as shown in FIGS. 2 to 4, minimum distance DL1 between the adjacent blue and green low-density pixels PXLb and PXLg is shorter than minimum distance DH1 between the adjacent blue and green high-density pixels PXHb and PXHg. In addition, minimum distance DL2 between the adjacent green and red low-density pixels PXLg and PXLr is shorter than minimum distance DH2 between the adjacent green and red high-density pixels PXHg and PXHr. In addition, minimum distance DL3 between the adjacent red and blue low-density pixels PXLr and PXLb is shorter than minimum distance DH3 between the adjacent red and blue high-density pixels PXHr and PXHb.

As described here, the length of the minimum distance between the adjacent low-density pixels PXL is shorter than the length of the minimum distance between the adjacent plurality of high-density pixels PXH. Since the plurality of low-density pixels PXL are provided at a lower density than the plurality of high-density pixels PXH in this manner, the edges of the individually patterned patterning layers are unlikely to overlap.

Hence, the edges of the patterning layers patterned individually in each of the adjacent low-density pixels PXL are unlikely to overlap. Therefore, the positions of the patterning layers patterned individually in each of the plurality of low-density pixels PXL can be more accurately identified. Hence, the plurality of low-density pixels PXL can function also as TEGs that serves as references for determining the offset positions of masks used in patterning the patterning layers.

In addition, at least one of the blue low-density pixels (first low-density pixels) PXLb, the green low-density pixels (second low-density pixels) PXLg, and the red low-density pixels (third low-density pixels) PXLr in the plurality of low-density pixels PXL preferably has a smaller area than the high-density pixels PXH that emit light of the same color.

In the present embodiment, for example, the blue low-density pixel PXLb is smaller in area than the blue high-density pixel PXHb. Therefore, the patterning layers patterned in the blue low-density pixels PXLb (the first charge transport layers 16Lb and the light-emitting layers 17Lb) do not need to be patterned as much as the patterning layers patterned in the blue high-density pixels PXHb (the first charge transport layers 16Hb and the light-emitting layers 17Hb), which restrains the edges of the patterning layers patterned in the adjacent pixels PX from overlapping.

In other words, for example, the formation area of the patterning layers patterned in the blue low-density pixels PXLb (the first charge transport layers 16Lb and the light-emitting layers 17Lb) has a smaller area than the formation area of the patterning layers patterned in the blue high-density pixels PXHb (the first charge transport layers 16Hb and the light-emitting layers 17Hb). Therefore, the first electrode 15Lb in the blue low-density pixel PXLb (see FIG. 4) may have a smaller area than the first electrode 15Hb in the blue high-density pixel PXHb (see FIG. 3).

In addition, for example, the red low-density pixel PXLr has a smaller area than the red high-density pixel PXHr. Therefore, the patterning layers patterned in the red low-density pixels PXLr (the first charge transport layers 16Lr and the light-emitting layers 17Lr) do not need to be patterned as much as the patterning layers patterned in the red high-density pixels PXHr (the first charge transport layers 16Hr and the light-emitting layers 17Hr), which restrains the edges of the patterning layers patterned in the adjacent pixels PX from overlapping.

In other words, for example, the formation area of the patterning layers patterned in the red low-density pixels PXLr (the first charge transport layers 16Lr and the light-emitting layers 17Lr) has a smaller area than the formation area of the patterning layers patterned in the red high-density pixels PXHr (the first charge transport layers 16Hr and the light-emitting layers 17Hr). Therefore, the first electrodes 15Lr in the red low-density pixels PXLr (see FIG. 4) may have a smaller area than the first electrodes 15Hr in the red high-density pixels PXHr (see FIG. 3).

Note that for example, the green low-density pixel PXLg may be approximately equal in area to, or a smaller in area than, the green high-density pixel PXHg.

In other words, for example, the formation area of the patterning layers patterned in the green low-density pixels PXLg (the first charge transport layers 16Lg and the light-emitting layers 17Lg) may have a smaller area than the formation area of the patterning layers patterned in the green high-density pixels PXHg (the first charge transport layers 16Hg and the light-emitting layers 17Hg). Therefore, the first electrodes 15Lg in the green low-density pixels PXLg (see FIG. 4) may have a smaller area than the first electrodes 15Hg in the green high-density pixels PXHg (see FIG. 3).

In addition, for example, the sum area of one blue low-density pixel PXLb, one green low-density pixel PXLg, and one red low-density pixel PXLr may be described as being smaller than the sum area of one blue high-density pixel PXHb, one green high-density pixel PXHg, and one red high-density pixel PXHr.

In addition, for example, one blue low-density pixel PXLb, one green low-density pixel PXLg, and one red low-density pixel PXLr are preferably equal in area. This facilitates aligning masks in individually patterning the patterning layers. Note that one blue low-density pixel PXLb, one green low-density pixel PXLg, and one red low-density pixel PXLr are not necessarily equal in area and may be different in area.

In addition, as shown in FIG. 2, the plurality of low-density pixels PXL may have a different plan-view shape from the plurality of high-density pixels PXH. The plurality of low-density pixels PXL, unlike the plurality of high-density pixels PXH, need only to have a shape that is easily detectable when a position acquisition device detects the edges through image processing. In the present embodiment, the blue high-density pixels PXHb, the green high-density pixels PXHg, and the red high-density pixels PXHr are all shaped like a quadrilateral with four curved corners, whereas the blue low-density pixels PXLb, the green low-density pixels PXLg, and the red low-density pixels PXLr are all circular. In particular, circular shapes are preferred because the shape allows for easy detection of edges, for example, through image processing. Note that each of the blue low-density pixels PXLb, the green low-density pixels PXLg, and the red low-density pixels PXLr is not necessarily circular and may have another shape, for example, the same shape as the high-density pixels PXH.

In addition, one blue low-density pixel PXLb, one green low-density pixel PXLg, and one red low-density pixel PXLr may have the same shape (e.g., circular) in a plan view. This also facilitates aligning masks in patterning the patterning layers. Note that one blue low-density pixel PXLb, one green low-density pixel PXLg, and one red low-density pixel PXLr do not necessarily have the same shape in a plan view and may all have different shapes in a plan view.

Note that for example, the plan-view shapes of the plurality of low-density pixels PXL and the plurality of high-density pixels PXH are, for example, defined by the openings 14a in the bank 14.

In addition, since the plurality of low-density regions 51a to 51g in the display area 5 are separated from each other as shown in FIG. 1, the patterning layers can be patterned in more accurate locations across the entire display area 5 than when the plurality of low-density regions are not separated from each other.

In addition, FIG. 1 shows an example where, among the low-density regions 51a to 51g, the low-density region 51a is located in the center of the display area 5 and the low-density regions 51b to 51g are located on the edges of the display area 5. However, the low-density regions 51a to 51g may be located anywhere, provided that the low-density regions 51a to 51g are located in the display area 5.

In addition, any number of low-density regions may be provided in the display area 5. At least one low-density region is located.

Figure 5:
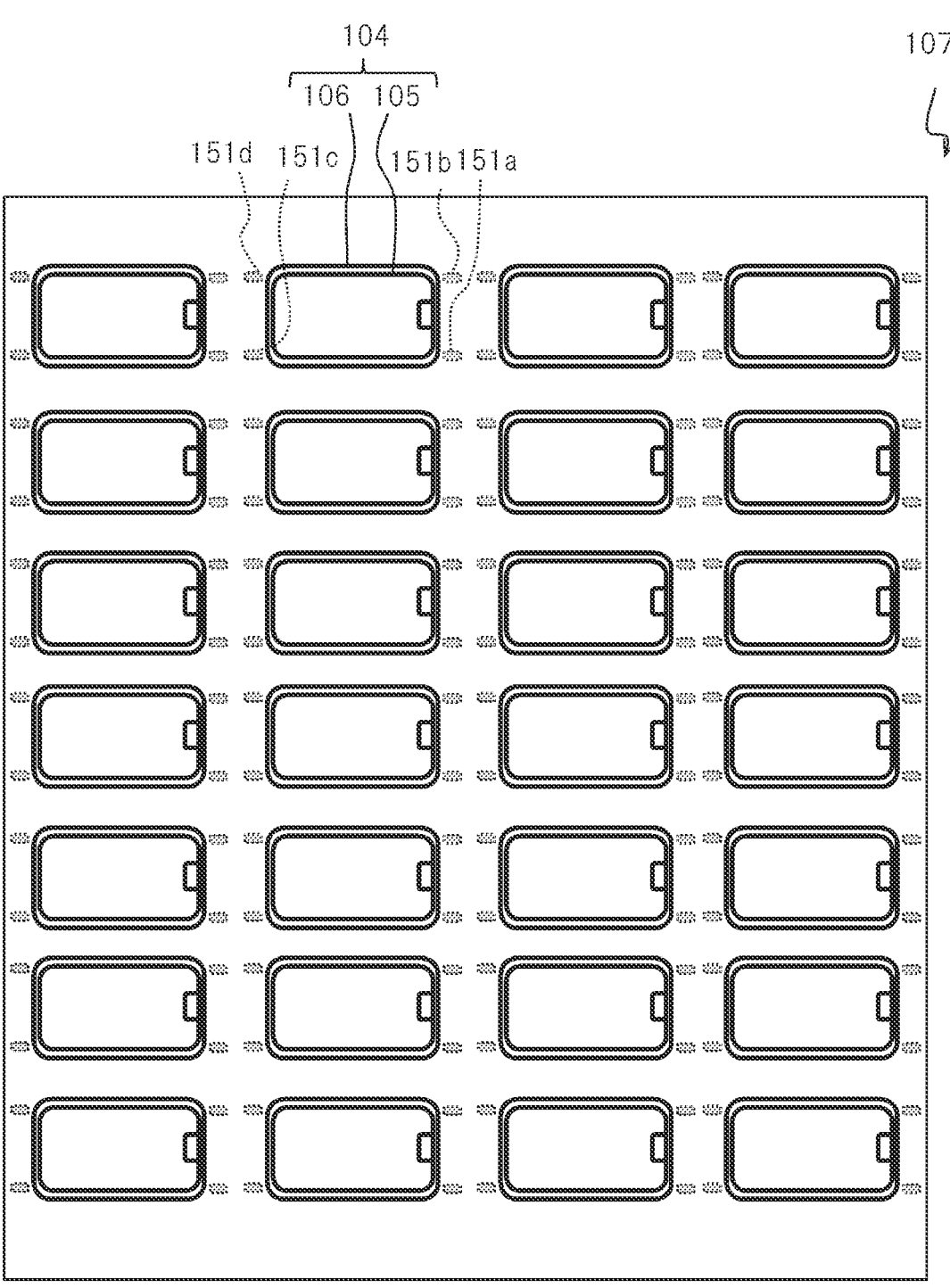
FIG. 5 is a plan view of a structure of a mother substrate in accordance with a comparative example.

FIG. 5 is a plan view of a structure of a mother substrate 107 in accordance with a comparative example. The mother substrate 107 is a large-sized substrate before display panels are cut out. The mother substrate 107 is already subjected to processes up to immediately before the vapor deposition of patterning layers (the first charge transport layers and the light-emitting layers).

The mother substrate 107 has a plurality of display panel formation areas 104 that will be display panels when cut out. The display panel formation areas 104 include: display-area formation areas 105 that will be display areas; and frame area formation areas 106 that will be frame areas.

The display-area formation area 105 has a matrix of pixel regions that will be pixels. The pixel regions have been fabricated up to the provision of the first electrodes and the bank on the array substrate. The patterning layers (the first charge transport layers and the light-emitting layers), the second charge transport layer, the second electrode, and the sealing layer, which will all be stacked on the first electrodes, are yet to be formed.

The display-area formation area 105 does not include the high-density pixels PXH and the low-density pixels PXL at different densities like the display area 5 (see FIG. 1) in accordance with the present embodiment and has the same pixel region density across the display-area formation areas 105.

The mother substrate 107 includes alignment-use TEGs 151a to 151d for determining the offset positions of masks used in vapor-depositing patterning layers outside the display-area formation areas 105. The TEGs 151a to 151d are disposed outside the display-area formation area 105 near the four corners of the display-area formation area 105 and separated from the display-area formation area 105. In the mother substrate 107, the TEGs 151a to 151d are provided for each display-area formation area 105.

Figure 6:
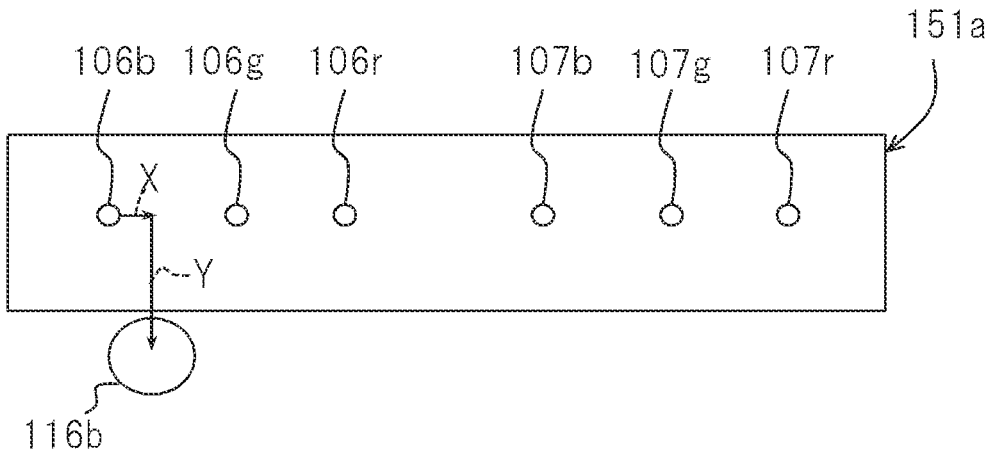
FIG. 6 is a schematic plan view of a structure of a TEG in accordance with a comparative example.

FIG. 6 is a schematic plan view of a structure of the TEG 151a in accordance with a comparative example. Note that the TEGs 151b to 151d have the same structure as the TEG 151a, and description thereof is omitted.

The TEG 151a has, for each patterning layer, an alignment mark that serves as a reference indicating the offset position of a mask used in vapor deposition. The TEG 151a has alignment marks 106b, 106g, 106r, 107b, 107g, and 107r arranged sequentially.

The alignment mark 106b indicates a reference position for a mask for vapor-depositing the first charge transport layers in the blue pixel regions. The alignment mark 106g indicates a reference position for a mask for patterning the first charge transport layers in the green pixel regions. The alignment mark 106r indicates a reference position for a mask for patterning the first charge transport layers in the red pixel regions.

The alignment mark 107b indicates a reference position for a mask for patterning the light-emitting layers in the blue pixel regions. The alignment mark 107g indicates a reference position for a mask for patterning the light-emitting layers in the green pixel regions. The alignment mark 107r indicates a reference position for a mask for patterning the light-emitting layers in the red pixel regions.

For example, in a vapor deposition device in which a mask has been placed for patterning the first charge transport layers in the blue pixel regions, first, a test pattern 116b is patterned near the alignment mark 106*b* through the mask to adjust the offset position of the mask. Then, the vapor deposition device computes the displacement amount between the position of the test pattern 116*b* and the position of the alignment mark 106*b* in the X-direction (first direction) and in the Y-direction (second direction) that is perpendicular to the X-direction by processing microscopy images. The vapor deposition device further computes the displacement amount in relative tilt (displacement amount in the θ-direction) between an entire mask 160 and an entire mother substrate 103.

The vapor deposition device then adjusts the offset position of the mask so as to reduce the computed displacement amounts in the X-direction, Y-direction, and θ-direction. This adjustment of the offset position of the mask is done for each patterning layer.

Figure 7:
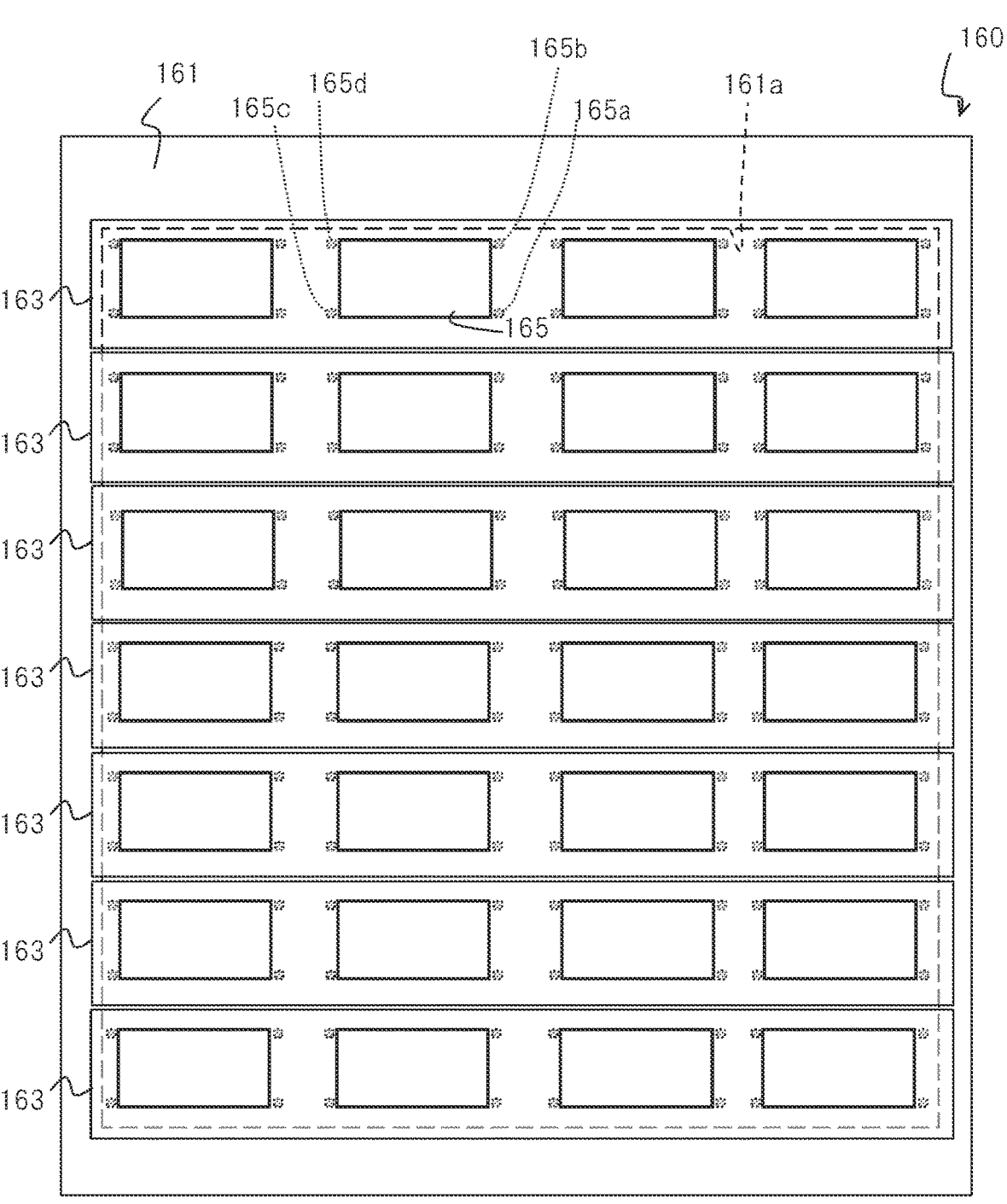
FIG. 7 is a schematic plan view of a structure of a mask in accordance with a comparative example.

FIG. 7 is a schematic plan view of a structure of the mask 160 in accordance with a comparative example. The mask 160 is used to pattern one or more of the patterning layers on the mother substrate 107 by vapor deposition. The mask 160 includes: a frame-shaped frame 161; and a plurality of mask sheets 163 attached to the frame 161 so as to cover the opening surrounded by the frame 161. The frame 161 and the plurality of mask sheets 163 are made of a metal material. Each mask sheet 163 is a "fine metal mask" shaped like a thin sheet. Each mask sheet 163 has both ends thereof fixed to the frame 161.

Each mask sheet 163 has a mask opening region 165 formed in a location corresponding to the display-area formation area 105 (see FIG. 5). A plurality of mask openings are formed in the mask opening region 165. The mask opening region 165 has a plurality of mask openings corresponding to the array pattern of the blue pixel regions. In addition, each mask sheet 163 has TEG openings 165*a* to 165*d* formed outside the mask opening region 165. The TEG openings 165*a* to 165*d* have, in a location corresponding to the alignment mark 106*b* (see FIG. 6) in the TEGs 151*a* to 151*d* (see FIG. 5), TEG openings formed for patterning the test pattern 116*b*.

The mask 160 is placed opposite the mother substrate 107 inside the vapor deposition device to vapor-deposit the first charge transport layers in the blue pixel regions on the mother substrate 10. The mask 160 placed inside the vapor deposition device is then adjusted in position relative to the mask 160 and the mother substrate 107 by determining the above-described offset position. Thereafter, the first charge transport layers are patterned in the blue pixel regions on the mother substrate 107 through the mask 160.

Figure 8:
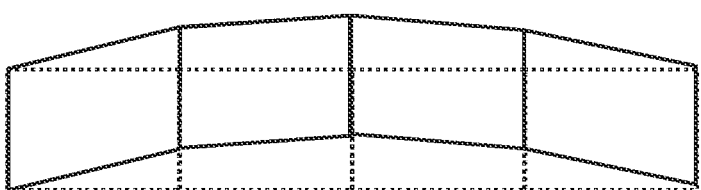
FIG. 8 is a schematic diagram illustrating a structure of a C-curved mask sheet.
Figure 9:
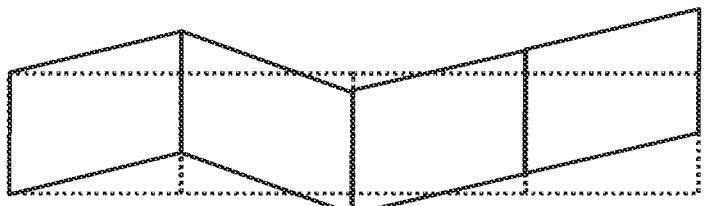
FIG. 9 is a schematic diagram illustrating a structure of an S-curved mask sheet.

FIG. 8 is a schematic diagram illustrating a structure of a C-curved mask sheet. FIG. 9 is a schematic diagram illustrating a structure of an S-curved mask sheet. The mask sheet 163 is preferably a rectangle that is straight in the major axis direction as indicated by broken lines in FIGS. 8 and 9. However, in reality, the mask sheet 163 can be, for example, slightly C-curved as indicated by solid lines in FIG. 8 or slightly S-curved as indicated by solid lines in FIG. 9 in, for example, etching for the formation of the mask openings. Therefore, the mask sheet 163 is formed with some strain and not a rectangle that is completely straight in the major axis direction.

Figure 10:
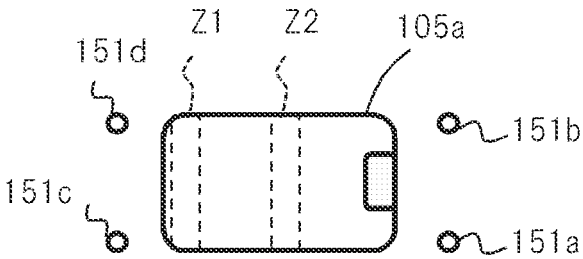
FIG. 10 is a schematic plan view of a structure of a display-area formation area in accordance with a comparative example after patterning layers are formed.

FIG. 10 is a schematic plan view of a structure of a display-area formation area 105*a* in accordance with a comparative example after the patterning layers are formed. The display-area formation area 105*a* is the display-area formation area 105 (see FIG. 5) on which a first charge transport layer and a light-emitting layer are formed in each blue pixel region, green pixel region, and red pixel region using a plurality of masks. In the display-area formation area 105*a*, a region Z1 is near the TEGs 151*c* and 151*d* among the TEGs 151*a* to 151*d*, and a region Z2 is far from any of the TEGs 151*a* to 151*d*.

Referring to FIGS. 8 and 9, the mask sheet 163 is slightly curved. Therefore, even if the relative positions of the mask 160 and the mother substrate 107 are adjusted as a whole, there may occur a partial discrepancy in position between the position where the patterning layer is patterned and the pixel.

Figure 11:
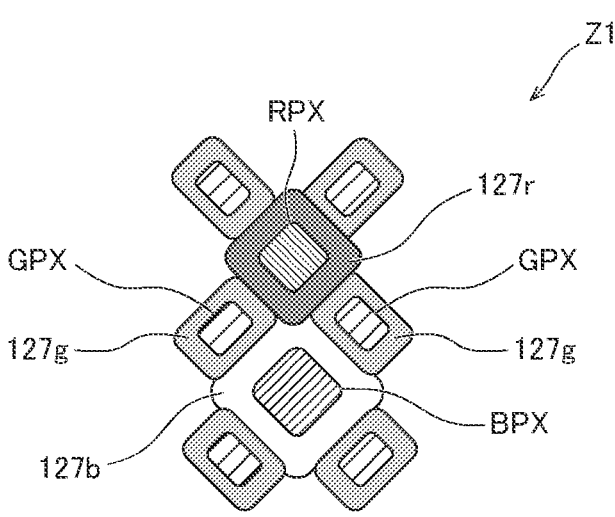
FIG. 11 is a schematic plan view of a structure of blue pixels, green pixels, and red pixels in a part of a region Z1 in FIG. 10.
Figure 12:
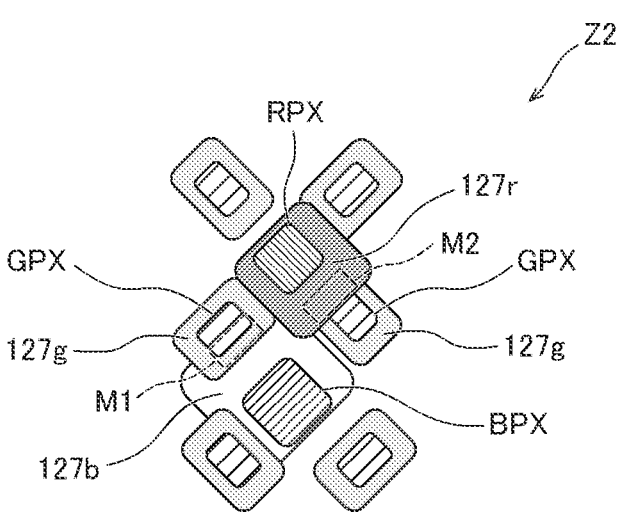
FIG. 12 is a schematic plan view of a structure of blue pixels, green pixels, and red pixels in a part of a region Z2 in FIG. 10.

FIG. 11 is a schematic plan view of a structure of a blue pixel BPX, a green pixel GPX, and a red pixel RPX in a part of the region Z1 in FIG. 10. FIG. 12 is a schematic plan view of a structure of the blue pixel BPX, the green pixel GPX, and the red pixel RPX in a part of the region Z2 in FIG. 10.

For example, as shown in FIG. 11, in the region Z1 near the TEGs 151*c* and 151*d* (see FIG. 10), a light-emitting layer 127*b* that emits blue light is formed in the blue pixel BPX without mixing color with adjacent pixels, a light-emitting layer 127*g* that emits green light is formed in the green pixel GPX without mixing color with adjacent pixels, and a light-emitting layer 127*r* that emits red light is formed in the red pixel RPX without mixing color with adjacent pixels. In contrast, as shown in FIG. 12, in the region Z2 far from any of the TEGs 151*a* to 151*d* (see FIG. 10), for examples, the light-emitting layer 127*b* formed in the blue pixel BPX is formed mixing color with the adjacent green pixels GPX as shown in region M1, and the light-emitting layer 127*r* formed in the red pixel RPX is formed mixing color with the adjacent green pixels GPX as shown in region M2.

As described here, in the mother substrate 107 in accordance with the comparative example shown in FIG. 5, since the TEGs 151*a* to 151*d*, which serve as references for determining the offset position of the mask 160, are provided outside the display-area formation area 105 where the patterning layer is actually patterned and separated from the display-area formation area 105, the overall relative positions of the mother substrate 107 and the mask 160 have low positional precision, and a partial discrepancy is likely to occur in relative position between the patterning layer and the pixel.

The positional discrepancy of the patterning layer between the edges and center of the display panel is likely to grow particularly in large-sized display panels such as high-definition display panels or television display panels.

Figure 13:
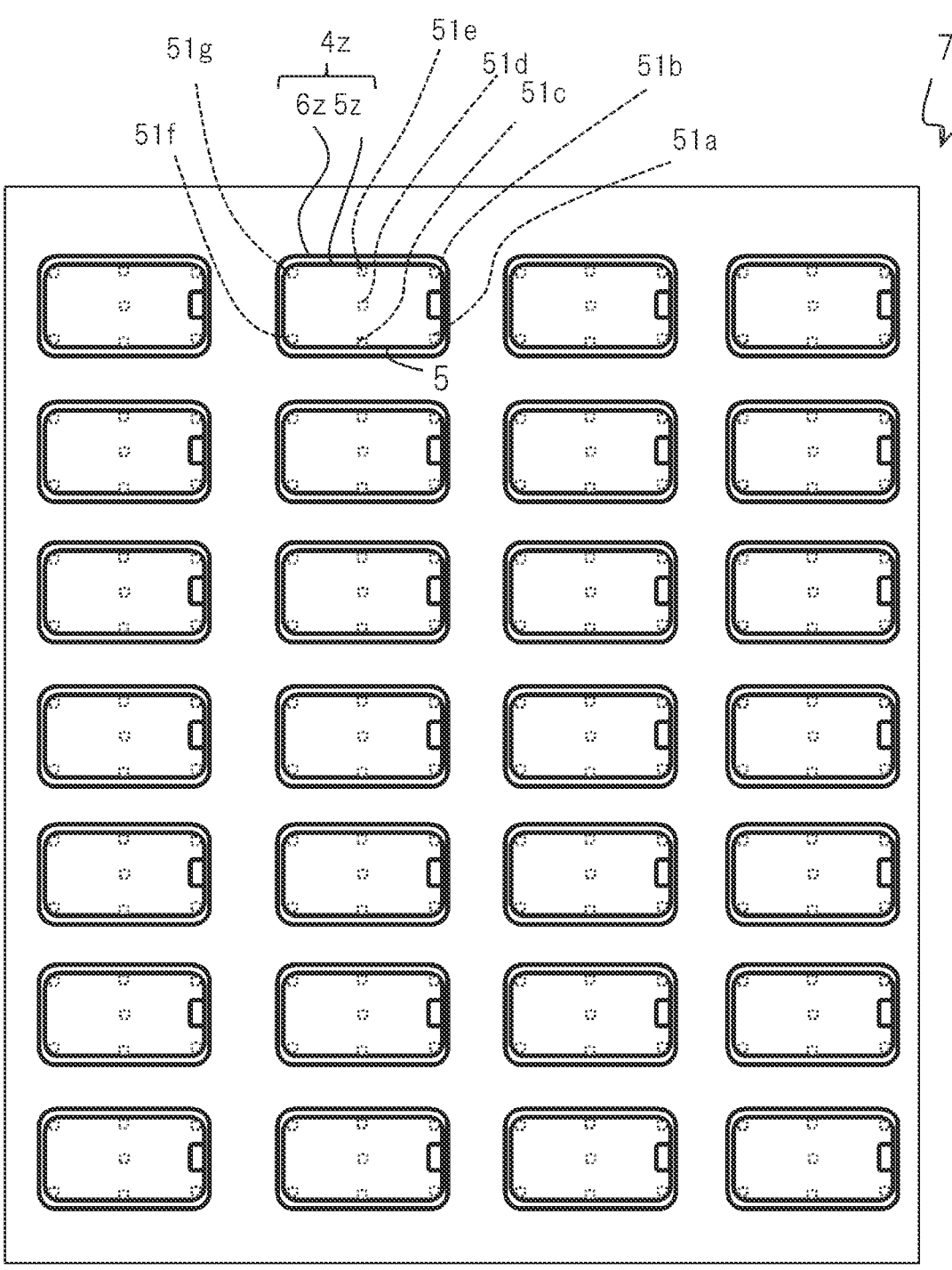
FIG. 13 is a plan view of a structure of a mother substrate in accordance with an embodiment.

FIG. 13 is a plan view of a structure of a mother substrate 7 in accordance with an embodiment. The mother substrate 7 is a large-sized substrate before the display panel 4 is cut out. The mother substrate 7 is already subjected to processes up to immediately before the formation of patterning layers (the first charge transport layers 16H and 16L and the light-emitting layers 17H and 17L).

The mother substrate 7 has a plurality of display panel formation areas 4*z* that will each provide the display panel 4 (see FIG. 1) when cut out. In the example shown in FIG. 13, the mother substrate 7 has 4×7 display panel formation areas 4*z*, but is not limited in this number of the display panel formation areas 4*z* provided in the mother substrate 7. The display panel formation area 4*z* includes a display-area formation area 5*z* that will be the display area 5 and a frame area formation area 6*z* that will be the frame area 6.

The display-area formation area 5*z* includes a matrix of pixel regions that will be the pixels PX (see FIG. 1). These pixel regions include high-density pixel regions that will be the high-density pixels PXH and low-density pixel regions that will be the low-density pixels PXL.

For example, the mother substrate 7 has the low-density regions 51a to 51g in the display-area formation area 5z. The low-density regions 51a to 51g each include a plurality of low-density pixel regions that will be the plurality of low-density pixels PXL. The plurality of low-density pixel regions function as alignment-use TEGs for determining the offset positions of masks used in patterning the patterning layers (the first charge transport layer 16L and the light-emitting layer 17L) on the mother substrate 7 and after the patterning layers are patterned, will be the plurality of low-density pixels PXL.

Note that the mother substrate 7 may or may not include, outside the display-area formation area 5z, alignment-use TEGs (e.g., the TEGs 151a to 151d shown in FIGS. 5 and 6) for determining the offset positions of masks used in patterning the patterning layers (the first charge transport layer 16L and the light-emitting layer 17L).

Figure 14:
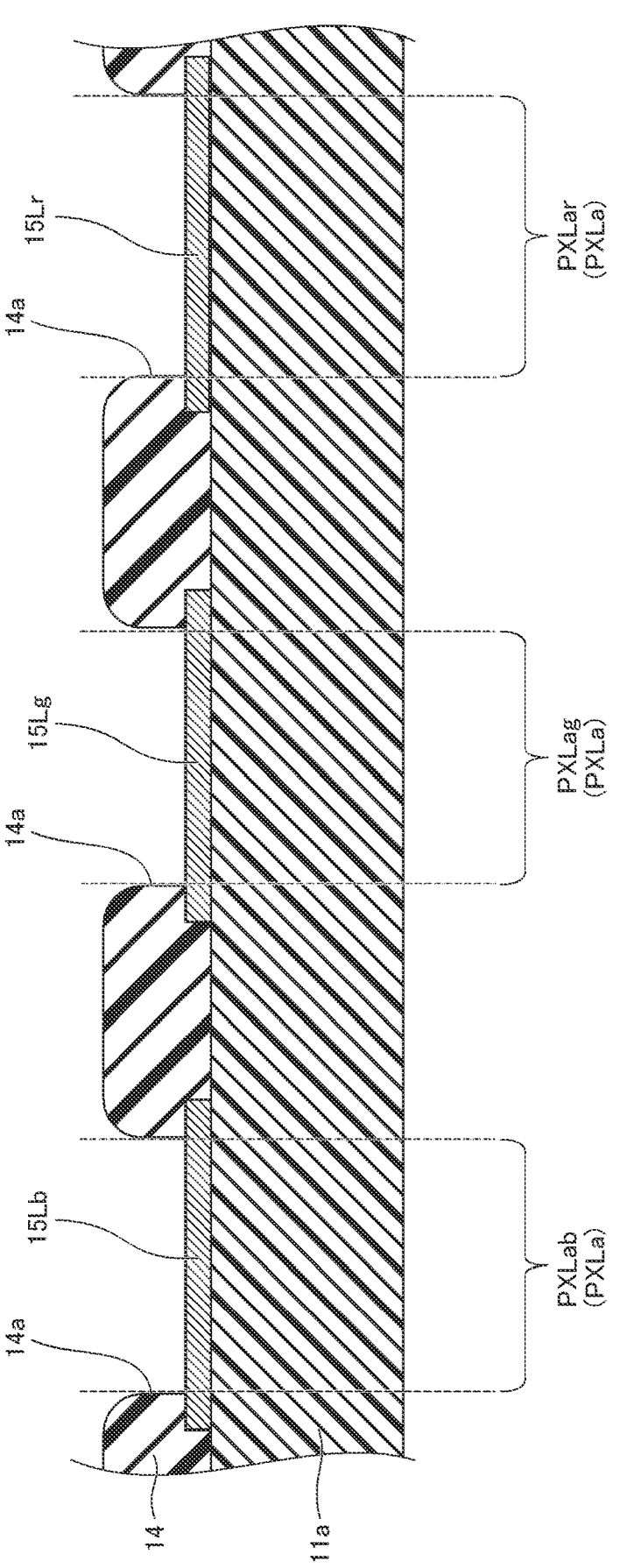
FIG. 14 is a cross-sectional view of a structure of low-density pixel regions provided in a display-area formation area 5z shown in FIG. 13.

FIG. 14 is a cross-sectional view of a structure of low-density pixel regions PXLa provided in the display-area formation area 5z shown in FIG. 13. For example, the low-density pixel regions PXLa include blue low-density pixel regions PXLab that will be the blue low-density pixels PXLb, green low-density pixel regions PXLag that will be the green low-density pixels PXLg, and red low-density pixel regions PXLar that will be the red low-density pixels PXLr.

Note that the blue high-density pixel regions that will be the blue high-density pixels PXHb, the green high-density pixel regions that will be the green high-density pixels PXHg, and the red high-density pixel regions that will be the red high-density pixels PXHr (not shown) differ from the blue low-density pixel regions PXLab, the green low-density pixel regions PXLag, and the red low-density pixel regions PXLar in that the former have a higher density in a plan view, but have the same layered structure.

The blue low-density pixel regions PXLab, the green low-density pixel regions PXLag, and the red low-density pixel regions PXLar include the first electrodes 15Lb, 15Lg, and 15Lr on an array substrate 11a and further include up to the bank 14 with the openings 14a on the array substrate 11a and include the second charge transport layer 18, the second electrode 19, and the sealing layer 20 which are patterning layers (the first charge transport layer 16L and the light-emitting layer 17L) that will be stacked on the first electrodes 15L shown in, for example, FIG. 4.

The array substrate 11a is a large-sized substrate before the array substrates 11 (FIGS. 3 and 4) are cut out for the individual display panels 4 and is continuous across the entire mother substrate 7. Similarly to the array substrate 11, the array substrate 11a includes s TFT in each pixel PX.

Figure 15:
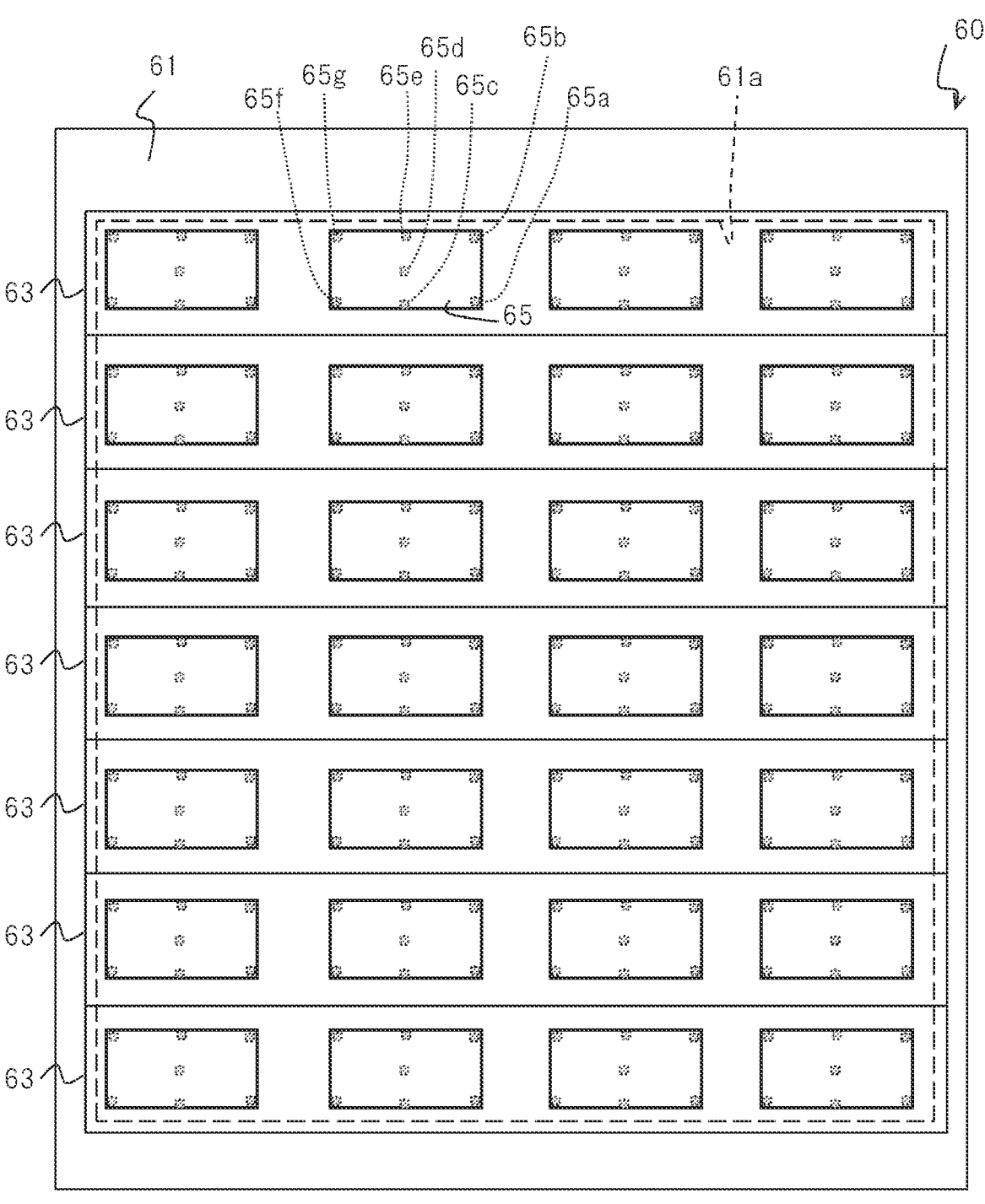
FIG. 15 is a schematic plan view of a structure of a mask in accordance with an embodiment.

FIG. 15 is a schematic plan view of a structure of a mask 60 in accordance with an embodiment. The mask 60 is used for patterning one of the patterning layers by vapor deposition or a like patterning method. The present embodiment assumes, as an example, the use of vapor deposition as a patterning method.

The mask 60 includes: a frame-shaped frame 61; and a plurality of mask sheets 63 attached to the frame 61 so as to cover an opening 61a surrounded by the frame 61. The frame 61 and the plurality of mask sheets 63 are made of a metal material. For example, each mask sheet 63 is a "fine metal mask" shaped like a thin sheet. For example, each mask sheet 63 has both ends thereof fixed to the frame 61.

Each mask sheet 63 has, in a location opposite the display-area formation area 5z (see FIG. 13) when disposed opposite the mother substrate 7, a mask opening region 65 with a plurality of mask openings. The mask opening region

65 has a plurality of mask openings that correspond to one of the array pattern of the blue high-density pixel regions and the blue low-density pixel regions PXLab (see FIG. 14), the array pattern of the green high-density pixel regions and the green low-density pixel regions PXLag (see FIG. 14), and the array pattern of the red high-density pixel regions and the red low-density pixel regions PXLar (see FIG. 14) in the display-area formation area 5z (see FIG. 13).

In addition, each mask sheet 63 has low-density regions 65a to 65g in the mask opening region 65. For example, the low-density regions 65a to 65g are each disposed in locations opposite the low-density regions 51a to 51g of the mother substrate 7 respectively when the mask 60 is disposed the mother substrate 7 (see FIG. 13).

The low-density regions 65a to 65g each have one of the array pattern of the blue low-density pixel regions PXLab, the array pattern of the green low-density pixel regions PXLag, and the array pattern of the red low-density pixel regions PXLar.

Note that in regions of the mask opening region 65 other than the low-density regions 65a to 65g, the array pattern of the blue high-density pixel regions is formed when the low-density regions 65a to 65g have mask openings in the array pattern of the blue low-density pixel regions PXLab, the array pattern of the green high-density pixel regions is formed when the low-density regions 65a to 65g have mask openings in the array pattern of the green low-density pixel regions PXLag, and the array pattern of the red high-density pixel regions is formed when the low-density regions 65a to 65g have mask openings in the array pattern of the red low-density pixel regions PXLar.

Figure 16:
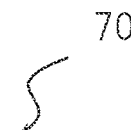
FIG. 16 is a schematic side view of a structure of a vapor deposition device in accordance with an embodiment.
Figure 16:
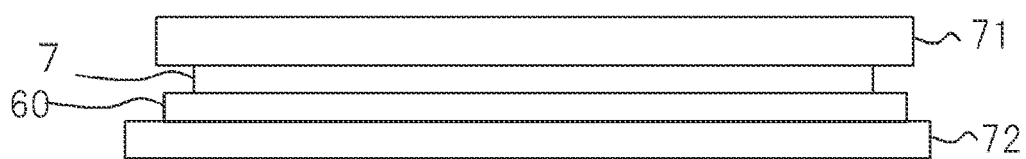

FIG. 16 is a schematic side view of a structure of a vapor deposition device 70 in accordance with an embodiment. For example, the vapor deposition device 70 includes a mother substrate support section 71 and a mask support section 72. Either one or both of the mother substrate support section 71 and the mask support section 72 have a drive mechanism so that one of the sections can adjust its position relative to the other.

When the vapor deposition device 70 vapor-deposits a patterning layer on the mother substrate 7, the mother substrate 7 is first placed on the mother substrate support section 71, and the mask 60 is placed on the mask support section 72. The mother substrate 7 and the mask 60 are hence disposed opposite each other.

Next, to adjust the offset position of the mask 60, the patterning layer (the first charge transport layer or the light-emitting layer) for inspecting the patterning position is vapor-deposited in any of the blue high-density pixel regions and the blue low-density pixel regions PXLab, the green high-density pixel regions and the green low-density pixel regions PXLag, and the red high-density pixel regions and the red low-density pixel regions PXLar on a face of the mother substrate 7 opposite the mask 60 via the mask 60.

Figure 17:
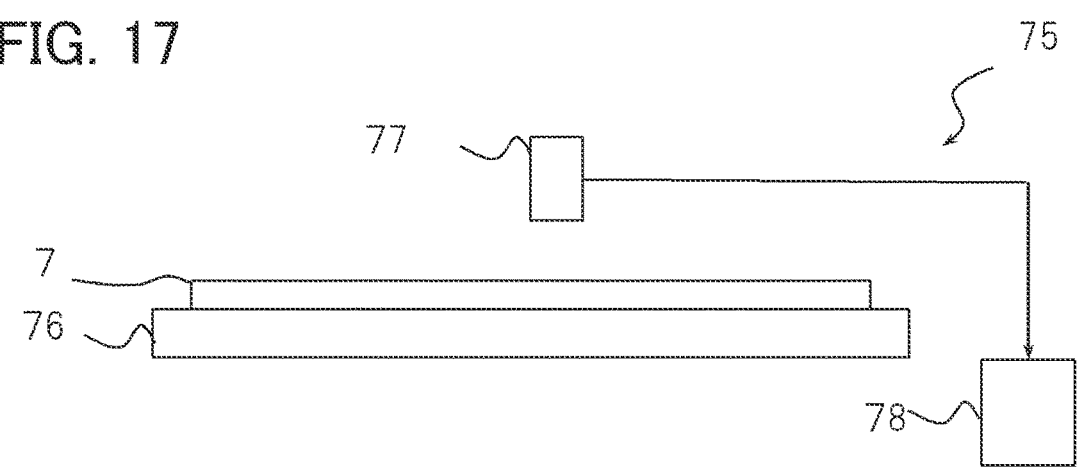
FIG. 17 is a schematic side view of a structure of a position acquisition device in accordance with an embodiment.

FIG. 17 is a schematic side view of a structure of a position acquisition device 75 in accordance with an embodiment. The position acquisition device 75 includes a substrate support section 76 for supporting the mother substrate 7; an image capturing section 77; and a control section 78.

The substrate support section 76 supports the mother substrate 7. The image capturing section 77 includes a microscope and outputs microscopy images as data to the control section 78.

The control section 78 includes a processor and a memory unit such as a memory to acquire a positional displacement amount between a pixel and a patterning layer by processing the images fed as data from the image capturing section 77. Note that the description here discusses an example where the control section 78 processes images to acquire a positional displacement amount between a pixel and a patterning layer. Alternatively, for example, the worker may acquire a positional displacement amount on the basis of the microscopy images.

Figure 18:
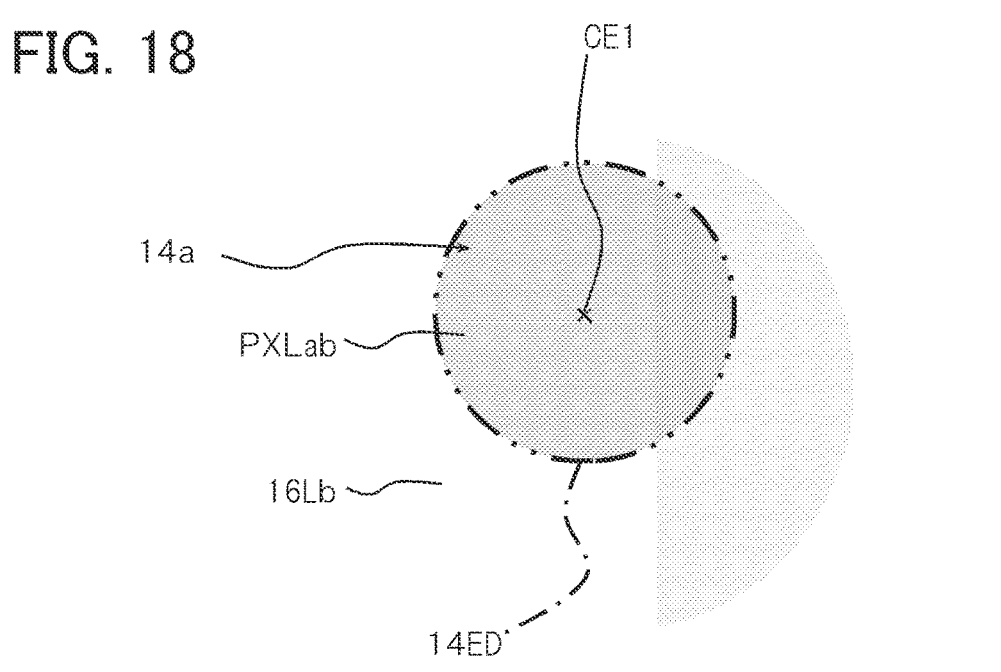
FIG. 18 is a diagram illustrating the position acquisition device in accordance with the embodiment detecting the position of a blue low-density pixel region.

FIG. 18 is a diagram illustrating the position acquisition device 75 in accordance with the embodiment detecting the position of the blue low-density pixel region PXLab. Here is shown an example where the vapor deposition device 70 vapor-deposits the first charge transport layer 16Lb in the blue low-density pixel region PXLab.

For example, the control section 78 acquires a location CE1 of the blue low-density pixel region PXLab by processing the images fed from the image capturing section 77. For example, the control section 78 identifies the location of an edge 14ED of the opening 14a in the bank 14 in the blue low-density pixel region PXLab by processing the images fed from the image capturing section 77. For example, the control section 78 identifies the circular edge 14ED along the edge of the circular opening 14a in the bank 14. The control section 78 then acquires the coordinates that typically indicate the location of the blue low-density pixel region PXLab (e.g., the coordinates of the center surrounded by the edge 14ED) from the identified edge 14ED, through computation as the location CE1 of the blue low-density pixel region PXLab.

Figure 19:
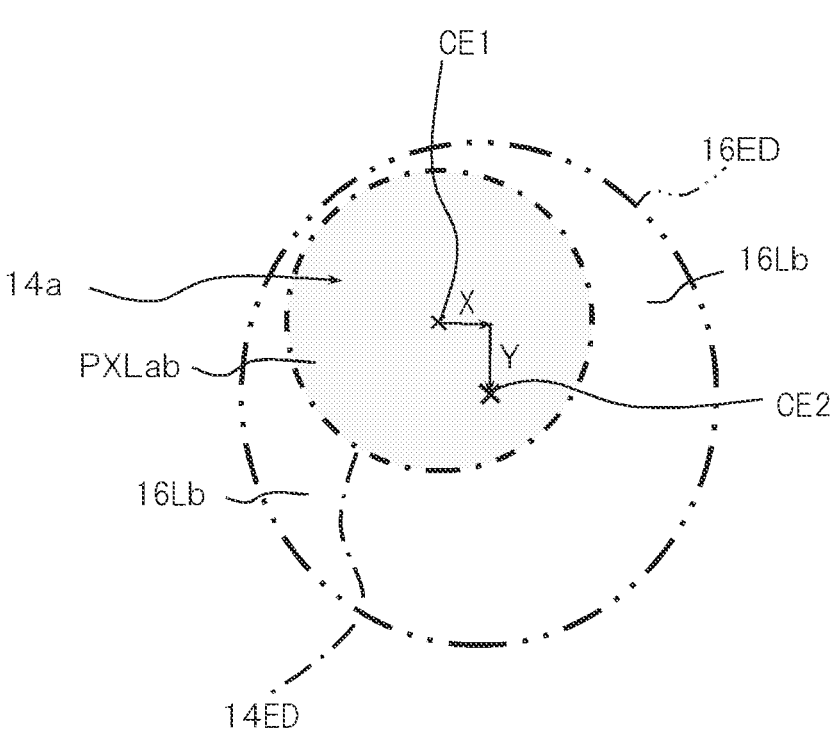
FIG. 19 is a diagram illustrating the position acquisition device in accordance with the embodiment acquiring the position of a first charge transport layer.

FIG. 19 is a diagram illustrating the position acquisition device 75 in accordance with the embodiment acquiring the position of the first charge transport layer 16Lb.

For example, the position acquisition device 75 acquires a location CE2 of the first charge transport layer 16Lb by processing the images fed from the image capturing section 77. For example, the control section 78 identifies the location of an edge 16ED of the first charge transport layer 16Lb by processing images on the basis of the images fed from the image capturing section 77. The control section 78 then acquires the coordinates that typically indicate the location of the first charge transport layer 16Lb (e.g., the coordinates of the center surrounded by the edge 16ED) from the identified edge 16ED, through computation as the location CE2 of the first charge transport layer 16Lb.

Next, the position acquisition device 75 computes the displacement amounts between the location CE1 and the location CE2 in the X-direction (first direction) and the Y-direction (second direction) perpendicular to the X-direction. The position acquisition device 75 further acquires the displacement amount in relative tilt (displacement amount in the θ-direction) between the entire mask 60 and entire mother substrate 7 through computation.

Then, in the vapor deposition device 70, the offset position of the mask 60 is adjusted to minimize this displacement amount on the basis of the displacement amounts in the X-direction, the Y-direction, and the θ-direction acquired by the position acquisition device 75. Hence, the offset adjustment of the vapor deposition device 70 is completed.

Here, the blue low-density pixel regions PXLab are provided at a lower density in the display-area formation area 5z than are the blue high-density pixel regions. Therefore, for example, even if the first charge transport layer 16Lg is patterned in the adjacent green low-density pixel regions PXLag or even if the first charge transport layer 16Lr is patterned in the adjacent red low-density pixel regions PXLar, the edge 16ED of the first charge transport layer 16Lb patterned in the blue low-density pixel region PXLab is restrained from overlapping the edge of another adjacent first charge transport layer (first charge transport layer 16Lg or first charge transport layer 16Lg) so that the edges are separated from each other for easy patterning. Therefore, the control section 78 can more accurately identify the edge 16ED of the first charge transport layer 16Lb through image processing. Consequently, the position acquisition device 75 can more accurately acquire the positional displacement amount between the blue low-density pixel region PXLab and the first charge transport layer 16Lb across the entire mother substrate 7.

Figure 20:
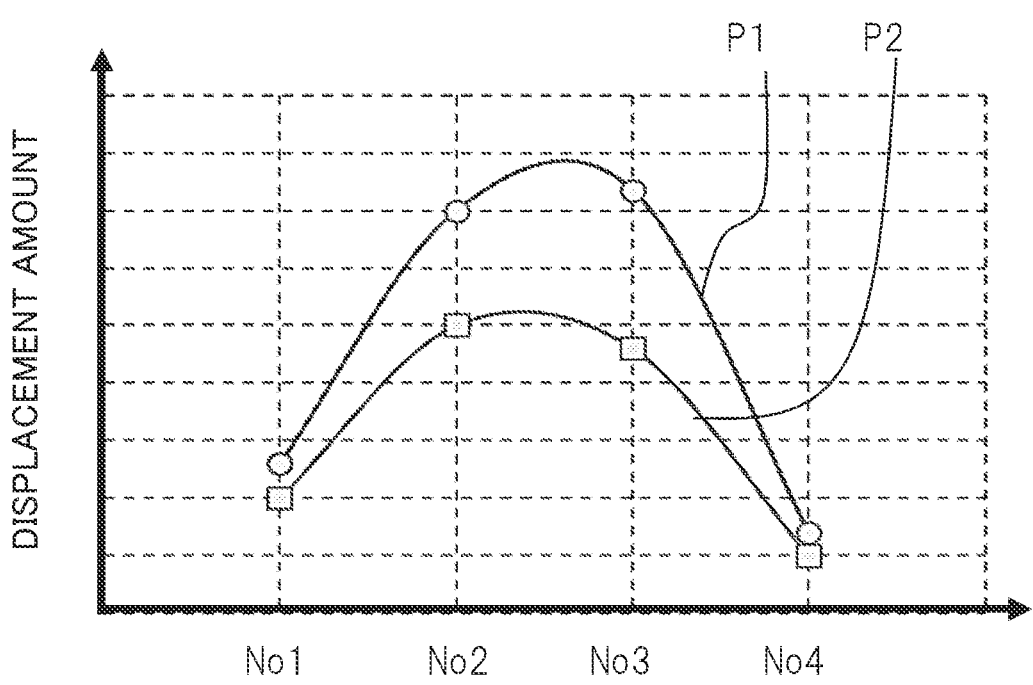
FIG. 20 is a diagram representing results of comparison of a displacement amount of a patterning position of a patterning layer after a mask in accordance with an embodiment is offset-adjusted and a displacement amount of a patterning position of a patterning layer after a mask in accordance with a comparative example is offset-adjusted.

FIG. 20 is a diagram representing results of comparison of a displacement amount of a patterning position of a patterning layer after a mask in accordance with an embodiment is offset-adjusted and a displacement amount of a patterning position of a patterning layer after a mask in accordance with a comparative example is offset-adjusted.

"No. 1" to "No. 4" on the horizontal axis of the graph in FIG. 20 denote the positions of the display-area formation areas 105, 5a arranged sequentially from left to right on the mother substrates 7, 107 (see FIGS. 5 and 13) as viewed from the front. In other words, the display-area formation areas 105, 5a denoted by No. 1 to No. 4 are a set of display-area formation areas in which the patterning layer is patterned using the same, single, substantially rectangular mask sheets 163, 63 (see FIGS. 7 and 15).

The vertical axis in the graph in FIG. 20 shows displacement amounts between the locations of the low-density pixel regions at the locations of the centers of the display-area formation areas 105, 5a of No. 1 to No. 4 and the positions where the patterning layer is patterned after the mask is adjusted in offset position.

In the graph in FIG. 20, a data string P1 represents a positional displacement amount of the patterning layer in the display-area formation area 105 after the mask in accordance with a comparative example is adjusted in offset position, and a data string P2 represents a positional displacement amount of the patterning layer in the display-area formation area 5z after the mask in accordance with an embodiment is adjusted in offset position.

FIG. 20 shows that the positional displacement amount of the patterning layer in accordance with an embodiment of the data string P2 is restrained to small values all across the display-area formation area in accordance with No. 1 to display-area formation area in accordance with No. 4, in relation to the positional displacement amount of the patterning layer in accordance with the comparative example represented by the data string P1.

In other words, for example, as shown in FIG. 8, it is understood that even if the mask sheet is not straight and has some strain, for example, even if the mask sheet is C-curved or S-curved, the positional discrepancy between the patterning layer and the pixels PX can be restrained all across the entire display panel 4 on the mother substrate 7 in such a manner that the patterning layer is restrained from being patterned exceedingly into the adjacent pixels PX. In other words, it is understood that the display device 1 improves the positional precision of the patterning layer across the entire display panel 4.

Figure 21:
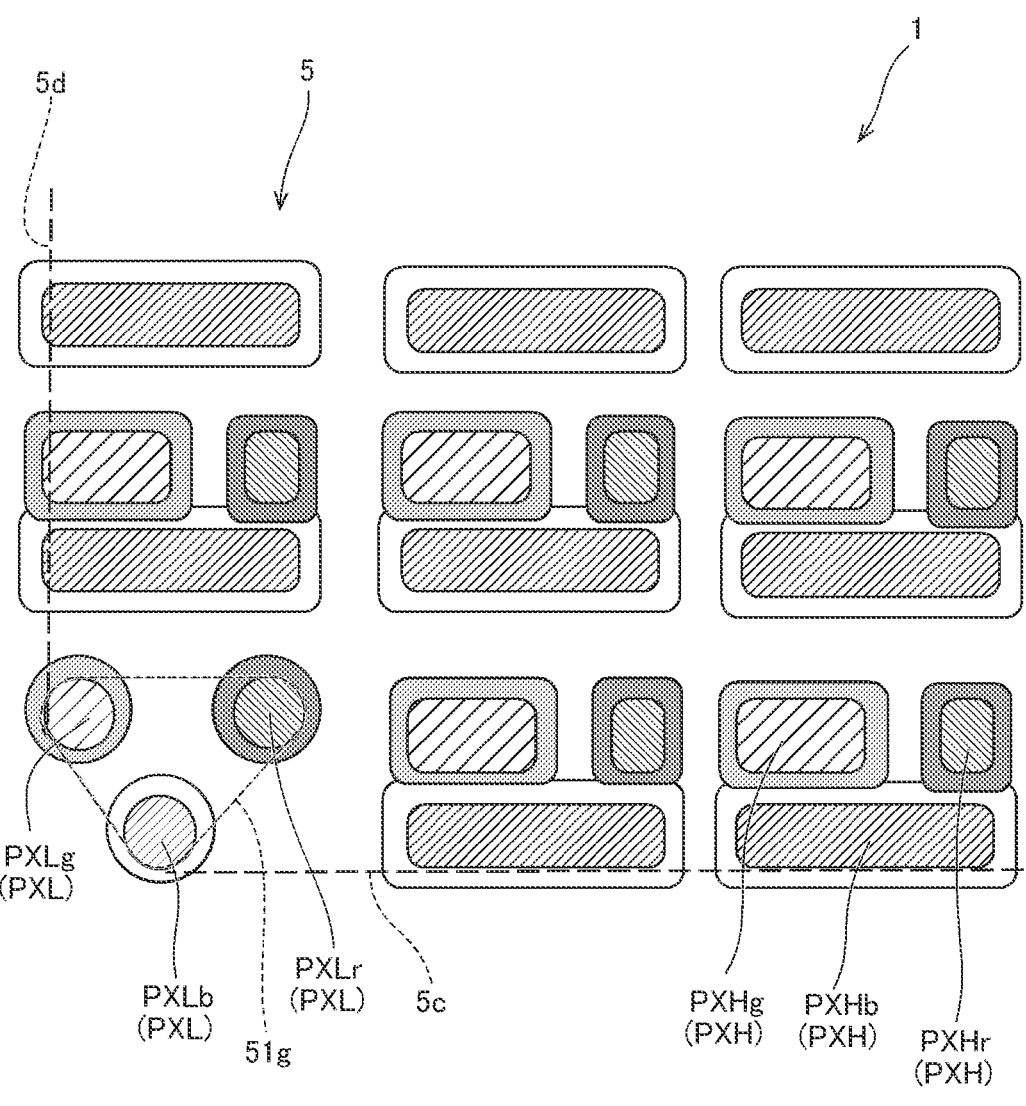
FIG. 21 is a schematic plan view of a structure of an array pattern of high-density pixels and an array pattern of low-density pixels in a display device in accordance with Variation Example 1 of an embodiment.

FIG. 21 is a schematic plan view of a structure of an array pattern of the high-density pixels PXH and the low-density pixels PXL in a display device in accordance with Variation Example 1 of an embodiment. FIG. 21 illustrates, for example, the high-density pixels PXH in the low-density region 51g (see FIG. 1) and in the surroundings of the low-density region 51g in the display area 5 of the display device 1.

FIG. 21 shows an example where the blue high-density pixels PXHb, the green high-density pixels PXHg, and the red high-density pixels PXHr and the blue low-density pixels PXLb, the green low-density pixels PXLg, and the red low-density pixels PXLr have an S-stripe array pattern. In the example shown in FIG. 21, the blue low-density pixels PXLb, the green low-density pixels PXLg, and the red low-density pixels PXLr are again provided in the display area 5 and at a lower density than the blue high-density pixels PXHb, the green high-density pixels PXHg, and the red high-density pixels PXHr.

In such an S-stripe array pattern, each of the blue low-density pixels PXLb, the green low-density pixels PXLg, and the red low-density pixels PXLr can again function not only as the pixel PX, but also as a TEG that serves as a reference for determining the offset position of a mask used in patterning the individual patterning layer.

Figure 22:
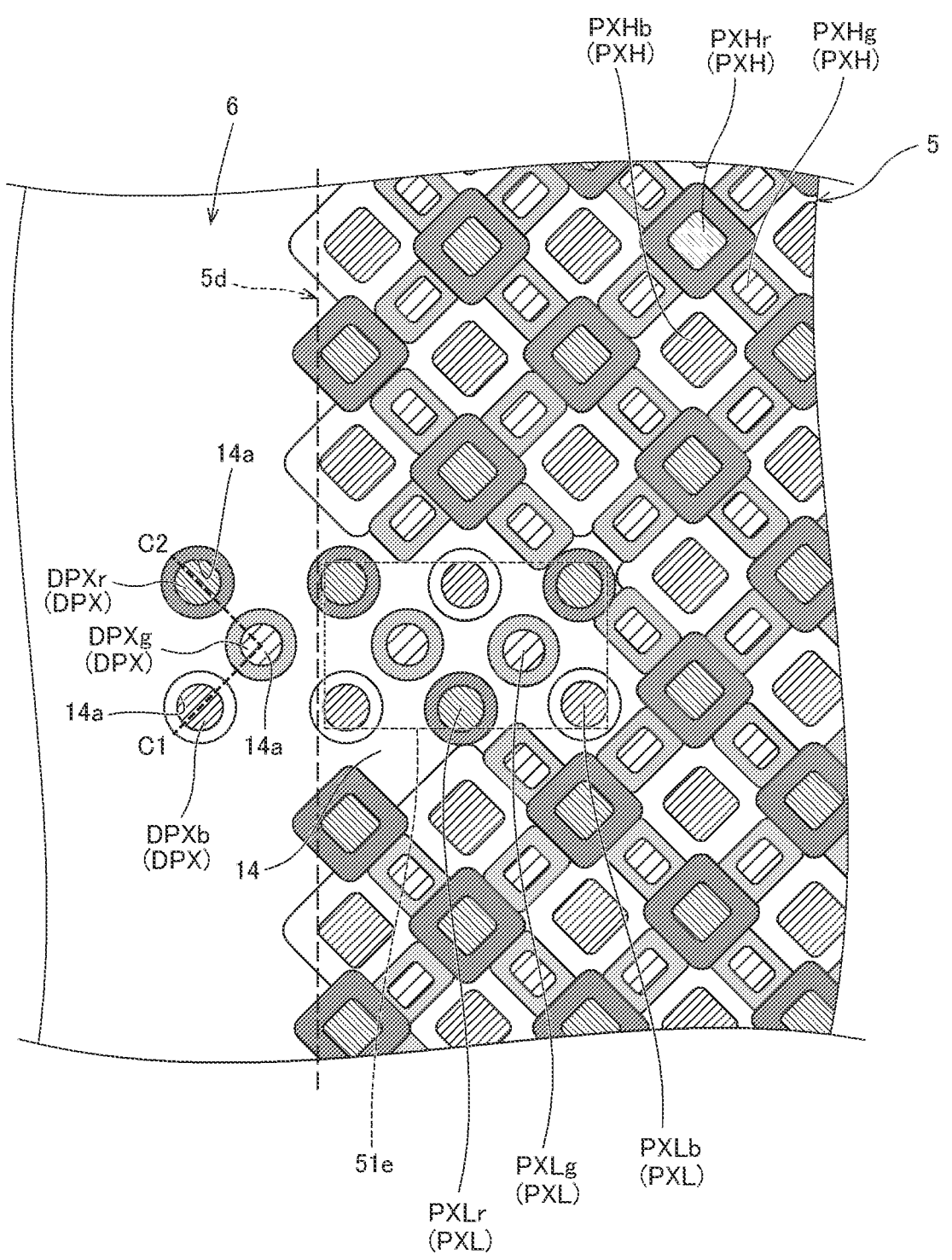
FIG. 22 is an enlarged plan view of a low-density region and a periphery of the low-density region of a display device in accordance with Variation Example 2 of an embodiment.

FIG. 22 is an enlarged plan view of the low-density region 51e and a periphery of the low-density region 51e of the display device 1 in accordance with Variation Example 2 of an embodiment. As shown in FIG. 22, the low-density pixels PXL are provided in the display area 5, and at least one dummy pixel DPX may be further provided in the frame area 6 outside the display area 5.

The at least one dummy pixel DPX, unlike the pixel PX in the display area 5, does not emit light. For example, the at least one dummy pixel DPX includes a plurality of dummy pixels DPX. For example, the plurality of dummy pixels DPX have the same array pattern as the plurality of low-density pixels PXL.

Figure 23:
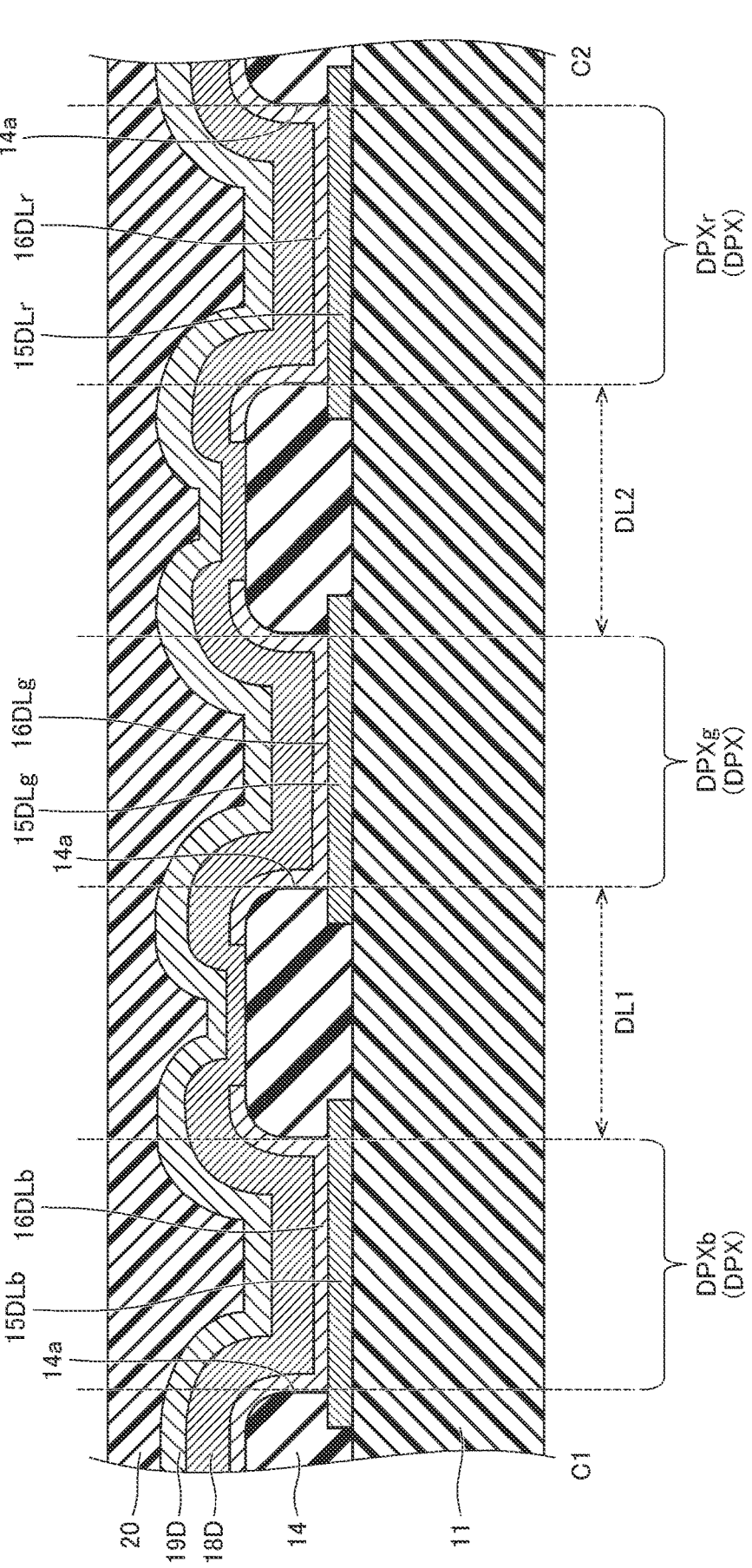
FIG. 23 is a cross-sectional view, taken along line C1-C2 shown in FIG. 22.

FIG. 23 is a cross-sectional view, taken along line C1-C2 shown in FIG. 22. As shown in FIGS. 22 and 23, the plurality of dummy pixels DPX include, for example, first dummy pixels DPXb having the same array pattern as the blue low-density pixels PXLb, second dummy pixels DPXg having the same array pattern as the green low-density pixels PXLg, and third dummy pixels DPXr having the same array pattern as the red low-density pixels PXLr.

For example, in a plan view, the first dummy pixels DPXb, the second dummy pixels DPXg, and the third dummy pixels DPXr have the same shape as the blue low-density pixels PXLb, the green low-density pixels PXLg, and the red low-density pixels PXLr respectively. Note that the plan-view shapes of the first dummy pixels DPXb, the second dummy pixels DPXg, and the third dummy pixels DPXr are, for example, defined by the openings 14a in the bank 14.

The first dummy pixels DPXb, unlike the blue low-density pixels PXLb, do not emit blue light. The first dummy pixels DPXb have, for example, the same structure as the blue low-density pixel PXLb with the light-emitting layer 17Lb being omitted and has otherwise the same layered structure as the blue low-density pixel PXLb.

For example, in the first dummy pixel DPXb, a first dummy electrode 15DLb, a first dummy charge transport layer (dummy layer) 16DLb, a second dummy charge transport layer 18D, a second dummy electrode 19D, and the sealing layer 20 are stacked in this order on the array substrate 11.

For example, the first dummy electrodes 15DLb are made of the same material, and provided in the same step, as the first electrodes 15H and 15L (see FIGS. 3 and 4). For example, the first dummy charge transport layers 16DLb are made of the same material, and provided in the same step, as the first charge transport layers 16Hb and 16Lb (see FIGS. 3 and 4). For example, the second dummy charge transport layer 18D contains the same material, and is provided in the same step, as the second charge transport layer 18 (see FIGS. 3 and 4). For example, the second dummy electrode 19D is made of the same material, and provided in the same step, as the second electrode 19 (see FIGS. 3 and 4).

The second dummy pixels DPXg, unlike the green low-density pixels PXLg, do not emit green light. The second dummy pixel DPXg has, for example, the same structure as the green low-density pixel PXLg with the light-emitting layer 17Lg being omitted and has otherwise the same layered structure as the green low-density pixel PXLg.

For example, in the second dummy pixel DPXg, a stack of a first dummy electrode 15DLg, a first dummy charge transport layer (dummy layer) 16DLg, the second dummy charge transport layer 18D, the second dummy electrode 19D, and the sealing layer 20 is stacked in this order on the array substrate 11.

For example, the first dummy electrodes 15DLg are made of the same material, and provided in the same step, as the first electrodes 15H and 15L (see FIGS. 3 and 4). For example, the first dummy charge transport layers 16DLg are made of the same material, and provided in the same step, as the first charge transport layers 16Hg and 16Lg (see FIGS. 3 and 4). For example, the second dummy charge transport layer 18D is made of the same material, and provided in the same step, as the second charge transport layer 18 (see FIGS. 3 and 4). For example, the second dummy electrode 19D is made of the same material, and provided in the same step, as the second electrode 19 (see FIGS. 3 and 4).

For example, in the third dummy pixel DPXr, a stack of a first dummy electrode 15DLr, a first dummy charge transport layer (dummy layer) 16DLr, the second dummy charge transport layer 18D, the second dummy electrode 19D, and the sealing layer 20 is stacked in this order the array substrate 11.

For example, the first dummy electrodes 15DLr are made of the same material, and provided in the same step, as the first electrodes 15H and 15L (see FIGS. 3 and 4). For example, the first dummy charge transport layers 16DLr are made of the same material, and provided in the same step, as the first charge transport layers 16Hr and 16Lr (see FIGS. 3 and 4). For example, the second dummy charge transport layer 18D is made of the same material, and provided in the same step, as the second charge transport layer 18 (see FIGS. 3 and 4). For example, the second dummy electrode 19D is made of the same material, and provided in the same step, as the second electrode 19 (see FIGS. 3 and 4).

The first dummy electrodes 15DLb and the first dummy charge transport layers 16DLb are provided like islands separated for each first dummy pixel DPXb. The first dummy electrodes 15DLg and the first dummy charge transport layers 16DLg are provided like islands separated for each second dummy pixel DPXg. The first dummy electrodes 15DLr and the first dummy charge transport layers 16DLr are provided like islands separated for each third dummy pixel DPXr.

The first dummy charge transport layers 16DLb are patterned using the same mask as the first charge transport layers 16Hb and 16Lb (see FIGS. 3 and 4). The first dummy charge transport layers 16DLg are patterned using the same mask as the first charge transport layers 16Hg and 16Lg (see FIGS. 3 and 4). The first dummy charge transport layers 16DLr are patterned using the same mask as the first charge transport layers 16Hr and 16Lr (see FIGS. 3 and 4).

The second dummy charge transport layer 18D is provided as a common layer across the first dummy pixels DPXb, the second dummy pixels DPXg, and third dummy pixels 19DPXr and continuous to the second charge transport layer 18 (see FIGS. 3 and 4). The second dummy electrode 19D is provided as a common layer across the first dummy pixels DPXb, the second dummy pixels DPXg, and the third dummy pixels 19DPXr and continuous to the second electrode 19 (see FIGS. 3 and 4).

In addition, the dummy pixels DPX are provided at a lower density than the high-density pixels PXH (see FIG. 2) so that the edges of the first dummy charge transport layers 16DHb, 16DHg, and 16DLr provided respectively in the adjacent dummy pixels DPX are unlikely to overlap.

For example, the minimum distance between the adjacent dummy pixels DPX is shorter than the minimum distance between the adjacent high-density pixels PXH (see FIGS. 2 and 3). For example, minimum distance DL1 between the adjacent first and second dummy pixels DPXb and DPXg is shorter than the minimum distance DH1 between the adjacent blue and green high-density pixels PXHb and PXHg (see FIGS. 2 and 3). In addition, minimum distance DL2 between the adjacent second and third dummy pixels DPXg and DPXr is shorter than minimum distance DH2 between the adjacent green and red high-density pixels PXHg and PXHr (see FIGS. 2 and 3). In addition, the minimum distance between the adjacent third and first dummy pixels DPXr and DP Xb is shorter than minimum distance DH3 between the adjacent red and blue high-density pixels PXHr and PXHb (see FIG. 2).

As described above, in each of the first dummy pixels DPXb, the second dummy pixels DPXg, and the third dummy pixels DPXr, the light-emitting layer is not patterned on each of the first dummy charge transport layers 16DLb, 16DLg, 16DLr.

Therefore, for example, after the first dummy charge transport layers 16DLb and the first charge transport layers 16Lb (see FIG. 4) are patterned individually in the first dummy pixels DP Xb and the blue low-density pixels PXLb, and the light-emitting layers 17Lb (see FIG. 4) are successively patterned on the first charge transport layers 16Lb (see FIG. 4) in the blue low-density pixels PXLb, the displacement amounts of the positions where the first dummy charge transport layers 16DLb are patterned and the displacement amounts of the positions where the light-emitting layers 17Lb are patterned can be measured in a single position measurement.

In addition, for example, after the first dummy charge transport layers 16DLg and the first charge transport layers 16Lg (see FIG. 4) are patterned individually in the second dummy pixels DPXg and the green low-density pixels PXLg, and the light-emitting layers 17Lg (see FIG. 4) are successively patterned on the first charge transport layers 16Lg (see FIG. 4) in the green low-density pixels PXLg, the displacement amounts of the positions where the first dummy charge transport layers 16DLg are patterned and the displacement amounts of the positions where the light-emitting layers 17Lg are patterned can be measured in a single position measurement.

In addition, for example, after the first dummy charge transport layers 16DLr and the first charge transport layers 16Lr (see FIG. 4) are patterned individually in the third dummy pixels DPXr and the red low-density pixels PXLr, and the light-emitting layers 17Lr (see FIG. 4) are successively patterned on the first charge transport layers 16Lr (see FIG. 4) in the red low-density pixels PXLr, the displacement amounts of the positions where the first dummy charge transport layers 16DLr are patterned and the displacement amounts of the positions where the light-emitting layers 17Lr are patterned can be measured in a single position measurement.

Hence, the position measurement takes less time than when positional displacement amounts are measured every time the first charge transport layers 16Lb, the first charge transport layers 16Lg, the first charge transport layers 16Lr, the light-emitting layers 17Lb, the light-emitting layers 17Lg, and the light-emitting layers 17Lr are individually patterned.

Note that the first dummy pixels DPXb, the second dummy pixels DPXg, and the third dummy pixels DPXr may not be electrically connected to, and hence separated from, other wires so as not to emit light. When this is the case, the first dummy pixel DPXb may include a dummy light-emitting layer (dummy layer) made of the same material, and provided in the same step, as the light-emitting layer 17Lb (see FIG. 4), the second dummy pixel DPXg may include a dummy light-emitting layer (dummy layer) made of the same material, and provided in the same step, as the light-emitting layer 17Lg (see FIG. 4), and the third dummy pixel DPXr may include a dummy light-emitting layer (dummy layer) made of the same material, and provided in the same step, as the light-emitting layer 17Lr (see FIG. 4).

Any of the elements described in the embodiments and variation examples may be used in a proper combination so long as the combination works out well.

The invention claimed is:

1. A display device comprising, in a display area where an image is displayed, a plurality of pixels that emits light, the plurality of pixels including:

a plurality of high-density pixels provided at a high density in the display area; and a plurality of low-density pixels provided at a lower density than the plurality of high-density pixels in the display area, wherein:

the plurality of low-density pixels includes a first low-density pixel that emits light of a first color, and a second low-density pixel that emits light of a second color that has a longer peak wavelength than does the light of the first color, the plurality of high-density pixels includes a first high-density pixel that emits light of the first color, and a second high-density pixel that emits light of the second color, either the first low-density pixel is smaller in area than the first high-density pixel, or the second low-density pixel is smaller in area than the second high-density pixel, the plurality of low-density pixels includes a patterning layer that is patterned individually in each of the plurality of low-density pixels, the plurality of low-density pixels includes a plurality of mutually adjacent low-density pixels, in the plurality of mutually adjacent low-density pixels, the patterning layers have edges separated from each other, and the display area is surrounded by a frame area including a plurality of dummy pixels that does not emit light, that includes a dummy layer containing a same material as the patterning layer, and that is provided at a lower density than the plurality of high-density pixels.

2. The display device according to claim 1, wherein adjacent low-density pixels of the plurality of low-density pixels are separated by a minimum distance that is longer than a minimum distance by which adjacent high-density pixels of the plurality of high-density pixels are separated.

3. The display device according to claim 1, wherein the plurality of high-density pixels includes a patterning layer that is patterned individually in each of the plurality of high-density pixels, and the patterning layer that is patterned individually in each of the plurality of low-density pixels is provided in a formation area that is smaller in area than a formation area in which the patterning layer that is patterned individually in each of the plurality of high-density pixels is provided.

4. The display device according to claim 1, wherein the first low-density pixel and the second low-density pixel are equal in area.

5. The display device according to claim 1, wherein each of the plurality of low-density pixels has a different shape in a plan view than each of the plurality of high-density pixels.

6. The display device according to claim 1, wherein the display area includes at least one low-density region where the plurality of low-density pixels is provided.

7. The display device according to claim 6, wherein the at least one low-density region comprises a plurality of low-density regions separated from each other.

8. The display device according to claim 6, wherein the at least one low-density region is provided in a center of the display area.

9. The display device according to claim 6, wherein the at least one low-density region is provided on an edge of the display area.

10. The display device according to claim 1, wherein the patterning layer is either a charge transport layer or a light-emitting layer.

11. The display device according to claim 1, wherein the plurality of dummy pixels has a same array pattern as the plurality of low-density pixels.

12. A display device comprising, in a display area where an image is displayed, a plurality of pixels that emits light, the plurality of pixels including:

a plurality of high-density pixels provided at a high density in the display area; and a plurality of low-density pixels provided at a lower density than the plurality of high-density pixels in the display area, wherein:

the plurality of low-density pixels includes a patterning layer that is patterned individually in each of the plurality of low-density pixels, the plurality of low-density pixels includes a plurality of mutually adjacent low-density pixels, and in the plurality of mutually adjacent low-density pixels, the patterning layers have edges separated from each other, and the display area is surrounded by a frame area including a plurality of dummy pixels that does not emit light, that includes a dummy layer containing a same material as the patterning layer, and that is provided at a lower density than the plurality of high-density pixels.

13. The display device according to claim 12, wherein the patterning layer is either a charge transport layer or a light-emitting layer.

14. A display device comprising, in a display area where an image is displayed, a plurality of pixels that emit light, the plurality of pixels including:

a plurality of high-density pixels provided at a high density in the display area; and a plurality of low-density pixels provided at a lower density than the plurality of high-density pixels in the display area, wherein:

the plurality of low-density pixels includes a patterning layer that is patterned individually in each of the plurality of low-density pixels, the plurality of low-density pixels includes a plurality of mutually adjacent low-density pixels, and in the plurality of mutually adjacent low-density pixels, the patterning layers have edges separated from each other, and the display area is surrounded by a frame area including a plurality of dummy pixels that does not emit light, that includes a dummy layer containing a same material as the patterning layer, and that has a same array pattern as the plurality of low-density pixels.

15. The display device according to claim 14, wherein the patterning layer is either a charge transport layer or a light-emitting layer.

* * * * *